(12) United States Patent
Chiba

(10) Patent No.: US 7,781,836 B2
(45) Date of Patent: Aug. 24, 2010

(54) SOI SEMICONDUCTOR DEVICE AND METHOD OF MANUFACTURING THEREOF

(75) Inventor: Tadashi Chiba, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 352 days.

(21) Appl. No.: 11/164,660

(22) Filed: Nov. 30, 2005

(65) Prior Publication Data

US 2006/0202268 A1  Sep. 14, 2006

(30) Foreign Application Priority Data

Dec. 1, 2004  (JP)  .............................. 2004-348198

(51) Int. Cl.
*H01L 27/12* (2006.01)
(52) U.S. Cl. ..................................... 257/347
(58) Field of Classification Search ......... 257/347–354, 257/E29.117, 66
See application file for complete search history.

(56) References Cited

U.S. PATENT DOCUMENTS

| | | | | |
|---|---|---|---|---|
| 5,936,278 A | * | 8/1999 | Hu et al. ..................... | 257/336 |
| 6,452,232 B1 | * | 9/2002 | Adan .......................... | 257/347 |
| 7,170,084 B1 | * | 1/2007 | Xiang et al. .................. | 257/19 |
| 7,335,929 B2 | * | 2/2008 | Lin et al. ..................... | 257/192 |
| 2003/0025159 A1 | * | 2/2003 | Hogyoku ..................... | 257/347 |
| 2004/0075141 A1 | * | 4/2004 | Maeda et al. ................ | 257/347 |
| 2004/0206990 A1 | * | 10/2004 | Liao et al. .................... | 257/288 |

FOREIGN PATENT DOCUMENTS

| | | |
|---|---|---|
| JP | 8/8431 A | 1/1996 |
| JP | 11/135795 A | 5/1999 |

* cited by examiner

*Primary Examiner*—Dao H Nguyen
*Assistant Examiner*—Tram H Nguyen
(74) *Attorney, Agent, or Firm*—Volentine & Whitt, P.L.L.C.

(57) ABSTRACT

An SOI semiconductor device has a substrate, an insulation film, a silicon film, a gate insulation film, a gate electrode, a pair of first diffusion regions, a first region, and a second diffusion region. The insulation film is formed on the substrate. The silicon film is formed on the insulation film. The gate insulation film is formed on the silicon film. The gate electrode is formed on the gate insulation film. The pair of first diffusion regions is formed in the silicon film while sandwiches the under part of the gate electrode in between. The first region is sandwiched by a pair of the first diffusion regions. The second diffusion region contacts with the first region while adjoins one of the first regions and has the same conductivity type with the first region.

19 Claims, 15 Drawing Sheets

(WIDTH DIRECTION OF GATE)

SOI SEMICONDUCTOR DEVICE AND METHOD OF MANUFACTURING THEREOF

BACKGROUND OF THE INVENTION

1. Field of the Invention

The present invention relates to an SOI semiconductor device, which in particular is capable of controlling the Kink effect, and a method of manufacturing such SOI semiconductor device.

2. Background Information

A conventional SOI-MOSFET (metal-oxide semiconductor field effect transistor) device has a structure in which transistors (MOSFETs) are formed on an SOI substrate in which a buried oxide film and a silicon film are formed on the support substrate. In this structure, each transistor has a source region, a drain region and a channel region which are formed in an active region (also called an element formation region) in the silicon film of the SOI substrate, a gate oxide film formed on the channel region, and a gate electrode formed on the gate oxide film. In the following description, the diffusion region that includes the source region, the drain region and the channel region, and the structure constituted of the gate oxide film and the gate electrode are to be referred to as a body part.

Generally, an SOI-MOSFET device is considered as having greater performance efficiency than a semiconductor device that uses a bulk substrate made of silicon. This is because each individual transistor is formed so as to be surrounded by an insulator which protects the transistor from electrical interference. In other words, since the body part of the transistor is electrically floating, a transistor is not electrically influenced by other elements. By having the body part of the transistor be in an electrically floating state, it is possible to decrease the parasitic capacitance, decrease possible leaks, or eliminate electrical interferences among transistors. As a result, it is possible to operate the transistor in a more desirable way. Performance efficiency in this case is a ratio between performance and power consumption and the like.

Moreover, in manufacturing the SOI-MOSFET device, it is possible to use a method of manufacturing a semiconductor device that uses bulk silicon (i.e. BULK-MOSFET) by applying slight changes to it. In this manufacturing method, processing steps are unchanged, but only easy layout modifications and small mask changes are required.

Accordingly, the SOI-MOSFET device can be considered as a superior semiconductor device which has achieved improved features as compared to the conventional BULK-MOSFET without having to increase its design cost.

However, with respect to the SOI-MOSFET device, since the body part of the transistor is in an electrically floating state as described above, the Kink effect, which is a phenomenon in which a drain current (Id) changes in a stepwise manner in a voltage-current characteristic (Vd-Id characteristic), may occur. Because of this, problems such as a skew being superimposed on an output signal over an input signal, especially at the time of operation by an analog signal, can occur. Furthermore, also in a digital circuit, a problem in which the circuit may operate unstably in transition can occur.

Therefore, with respect to the SOI-MOSFET device, it is a problem in that the circuit may operate unstably.

For example, Japanese Laid Open Patent Application No. 8-8431 and Japanese Laid Open Patent Application No. 11-135795 disclose some methods which cope with the problems of the Kink effect. In the methods introduced in Japanese Laid Open Patent Application No. 8-8431 and Japanese Patent Application Laid Open No. 11-135795, another diffusion region (i.e. a channel contact region) is formed in addition to a diffusion region of a transistor, and this additional diffusion region is electrically connected to a channel region by which the electric charge (i.e. electron holes or electrons) accumulated in the channel region is drawn out through the channel contact region. In this technology, the channel region and the channel contact region are electrically connected through an hourglass region formed as an extension of the channel region (q.v. Japanese Laid Open Patent Application No. 8-8431, FIG. 1) or through a low impurity density zone (q.v. Japanese Laid Open Patent Application No. 11-135795, FIG. 2) which is electrically connected with the channel region.

As mentioned above with respect to Japanese Laid Open Patent Application No. 8-8431 and Japanese Laid Open Patent Application No. 11-135795, when forming an additional channel contact region besides the diffusion region, additional structure has to be added in order to electrically connect the channel contact region with the channel region. Therefore, considering that elements have to be laid out in a limited area of a chip in particular, major changes in the entire layout is required. As a result, the all of the masks needed in a series of processes starting from the process of forming the diffusion region up to the process of forming a metal (i.e. wirings and electrodes, etc.) have to be changed, and this leads to a problem of increasing the design cost.

In view of the above, it will be apparent to those skilled in the art from this disclosure that there exists a need for an improved SOI semiconductor device which is capable of controlling the Kink effect and which requires low cost for design, and a method of manufacturing such SOI semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide an SOI semiconductor device which is capable of controlling the Kink effect and which requires low cost for design, and a method of manufacturing such SOI semiconductor device.

In accordance with a first aspect of the present invention, an SOI semiconductor device has a substrate, an insulation film, a silicon film, a gate insulation film, a gate electrode, a pair of first diffusion regions, a first region, and a second diffusion region. The insulation film is formed on the substrate. The silicon film is formed on the insulation film. The gate insulation film is formed on the silicon film. The gate electrode is formed on the gate insulation film. The pair of first diffusion regions is formed in the silicon film which sandwiches the underside of the gate electrode therebetween. The first region is sandwiched by a pair of the first diffusion regions. The second diffusion region contacts with the first region while adjoining one of the first regions and has the same conductivity type with the first region.

In accordance with a second aspect of the present invention, a method of manufacturing an SOI semiconductor device comprises the steps of: preparing an SOI semiconductor substrate having a substrate, an insulation film and a silicon film, the insulation film being formed on the substrate, the silicon film being formed on the insulation film and having a first conductivity type; forming a gate insulation film on a part of the silicon film; forming a gate electrode on the gate insulation film; forming a first diffusion region by implanting ions having the second conductivity type in a pair of regions in the silicon film except for a part adjoining the first region, the pair of regions sandwiching a first region, the second conductivity type being opposed to the first conductivity type; and forming a second diffusion region by implanting ions having the first conductivity type in the portion of the pair of regions adjoining the first region.

In accordance with a third aspect of the present invention, the method of manufacturing an SOI semiconductor device according to the second aspect of the present invention further comprises the step of: forming an insulation region in a second region which divides the first region in the width direction of the gate electrode.

In accordance with a fourth aspect of the present invention, the SOI semiconductor device according to the second aspect of the present invention further comprises the step of: forming an insulation region in the second region while forming a field region for dividing an active region in the silicon film.

In accordance with a fifth aspect of the present invention, in the method of manufacturing an SOI semiconductor device according to the third aspect of the present invention, the second region adjoins the second diffusion region.

In accordance with a sixth aspect of the present invention, in the method of manufacturing an SOI semiconductor device according to the fourth aspect of the present invention, the second region adjoins the second diffusion region.

In accordance with a seventh aspect of the present invention, in the method of manufacturing an SOI semiconductor device according to the third aspect of the present invention, the insulation film is formed by thermal oxidizing a portion of the silicon film.

In accordance with an eighth aspect of the present invention, in the method of manufacturing a SOI semiconductor device according to the fourth aspect of the present invention, the insulation film is formed by thermal oxidizing a portion of the silicon film.

In accordance with a ninth aspect of the present invention, in the method of manufacturing an SOI semiconductor device according to the second aspect of the present invention, a plurality of the second diffusion regions are formed for every predetermined length in the width direction of the gate electrode.

In accordance with a tenth aspect of the present invention, the method of manufacturing an SOI semiconductor device according to the third aspect of the present invention, in a plurality of the insulation regions are formed for every predetermined length in the width direction of the gate electrode.

In accordance with an eleventh aspect of the present invention, in the method of manufacturing an SOI semiconductor device according to the fourth aspect of the present invention, a plurality of the insulation regions are formed for every predetermined length in the width direction of the gate electrode.

In accordance with a twelfth aspect of the present invention, in the method of manufacturing an SOI semiconductor device according to the second aspect of the present invention, the gate electrode has an interdigital shape having fingers, the first diffusion region is formed between under portions of two fingers which adjoin in the length direction of the gate electrode, the first diffusion region being shared by two element structures which are respectively formed along the two fingers adjoining in the length direction of the gate electrode, and the second diffusion region is formed between under portions of two fingers which adjoin in the length direction of the gate electrode, the second diffusion region being shared by two element structures which are respectively formed along the two fingers adjoining in the length direction of the gate electrode.

In accordance with a thirteenth aspect of the present invention, the method of manufacturing an SOI semiconductor device according to the second aspect of the present invention further comprises the step of: forming salicide films on the first and second regions.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Now a first embodiment of the present invention will be described with reference to the drawings. In the following, an SOI semiconductor device (SOI-MOSFET device) with a single gate, where a MOSFET having an N channel formed therein (hereinafter to be referred to as N-MOSFET) is formed in an active region of an SOI substrate, will be described as an example.

Structure

Figure 1:
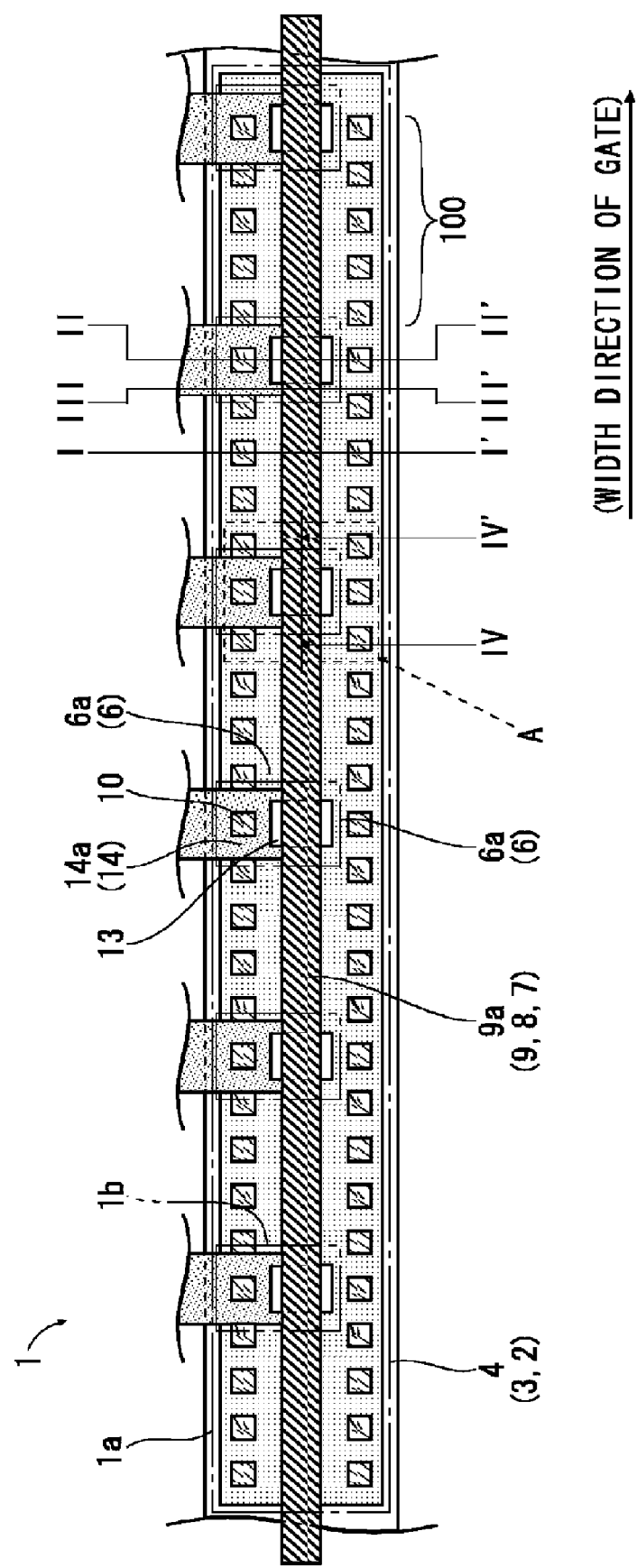
FIG. 1 is a diagram showing a structure of an SOI-MOSFET device according to a first embodiment of the present invention.

FIG. 1 is a diagram showing a structure of an SOI-MOSFET device 1 according to the first embodiment of the present invention. Note that FIG. 1 does not show the entire structure, but only a portion of the MOSFET in an SOI wafer in order to make the following explanation simple. FIG. 2 to FIG. 5 show the structures of sections I-I', IV-IV' indicated in FIG. 1. The section I-I' is a section in the vicinity of the center of a MOSFET region 1a when cut at a surface which is perpendicular to the width direction of the gate. The section II-II' is a section in the vicinity of the center of a channel contact region 1b when cut at a surface which is perpendicular to the width direction of the gate. The section III-III' is a section in the channel contact region 1b on the side of the MOSFET region 1a when cut at a surface which is perpendicular to the width direction of the gate. The section IV-IV' is a section in an insulation region 13 of the channel contact region 1b when cut at a surface which is perpendicular to the width direction of the gate.

As shown in FIG. 1 to FIG. 5, the SOI-MOSFET device 1 has a structure in which the MOSFET region 1a and the channel contact regions 1b are formed in an active region of an SOI substrate. The SOI substrate has a structure in which a support substrate 2 is laminated sequentially with an buried oxide film 3 and a silicon film. In this particular embodiment of the invention, a structure in which the channel contact regions 1b are incorporated inside the MOSFET region 1a is applied as an example. In this structure, as shown in FIG. 1, a $P^+$ diffusion region 14 of the channel contact region 1b is disposed at a location that divides one of two portions of the $N^+$ diffusion region 6, which sandwich a channel region (or channel formation region) 7, in the width direction of the gate. A region in the silicon film of the SOI substrate where elements are not formed (i.e. a field region) is either oxidized or has a groove formed therein in which an insulating substance is to be embedded. By this arrangement, as shown in FIG. 1, an element separation insulation film 4 for blocking electrical connections between/among elements is formed.

The MOSFET region 1a mainly consists of the channel region 7, a gate electrode 9 and the $N^+$ diffusion region 6. As shown in FIG. 1, the gate electrode 9 is formed on the channel region 7 and continuously along the channel region 7. Here, the gate electrode 9 should not be divided by the channel contact region 1b. As shown in FIG. 1, the two portions of the $N^+$ diffusion region 6 are formed along the channel region 7 such that they sandwich the channel region 7. Here one of the two portions of the $N^+$ diffusion region 6 is divided by the channel contact region 1b. The channel contact region 1b will be described later on in more detail. The width direction of the gate in this description means a direction which is the same as the width direction of the channel, and it is a direction which is perpendicular with the direction in which binding the source region and the drain region (i.e. the two portions of the $N^+$ diffusion region 6), i.e. a direction which is perpendicular with the direction in which the channel is formed, and which is parallel with the extending surface of the element separation insulation film 4 (q.v. FIG. 1). On the other hand, the longitudinal direction of the gate in this description means a direction which is the same as the longitudinal direction of the channel, and it is a direction in which binding the source region and the drain region, i.e. the direction in which the channel is formed.

(Structure of I-I' Section)

Figure 2:
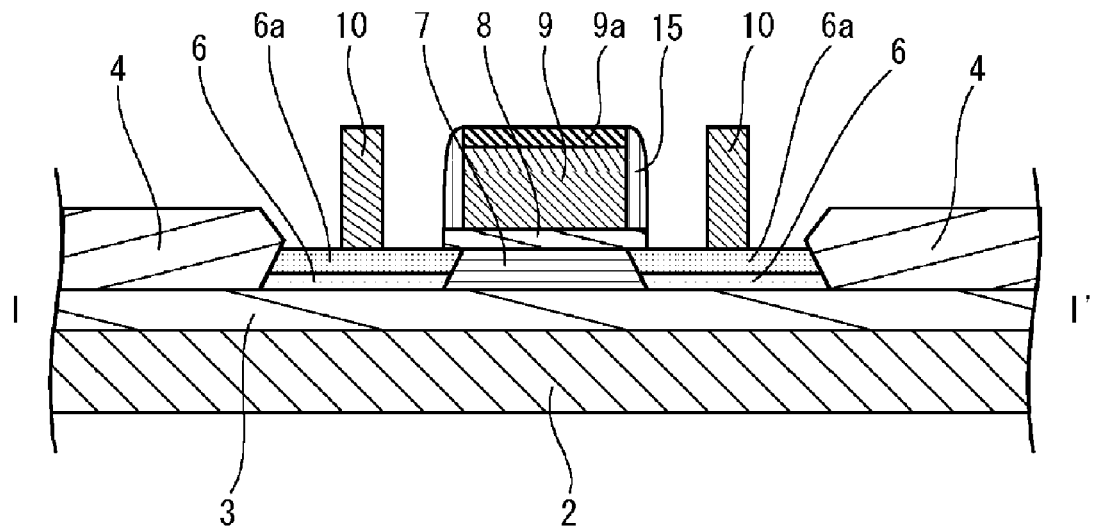
FIG. 2 is a sectional view showing a section I-I' of the SOI-MOSFET device according to the first embodiment of the present invention.

Now a structure of a section taken along I-I' indicated in FIG. 1 will be described with reference to FIG. 2. As shown in FIG. 2, the structure of the I-I' section of the MOSFET includes the channel region 7, two portions of the $N^+$ diffusion region 6, a gate oxide film 8 and a gate electrode 9, all formed in the active region of the SOI substrate.

As shown in FIG. 2, the two portions of the $N^+$ diffusion region 6 are the source and drain regions, and they are formed in a way which sandwich the channel region 7. The $N^+$ diffusion region 6 is doped with N type impurities in high concentration and has N type conductivity. On the other hand, the channel region 7 is doped with P type impurities in lower concentration as compared with the $N^+$ diffusion region 6 and has P type conductivity.

As shown in FIG. 2, the gate oxide film 8 is formed in between the channel region and the gate electrode 9. On both sides of the gate electrode 9, which are parallel with the width direction of the gate, side walls 15 are formed, respectively. On the surfaces of the $N^+$ diffusion region 6 and the gate electrode 9, salicide films 6a and 9a are formed, respectively. By salicidising the surfaces of the $N^+$ diffusion region 6 and the gate electrode 9, the resistance at these portions can be decreased, and it is made possible to obtain favorable current characteristics. On the salicidised surface of the $N^+$ diffusion region 6, contacts 10 are formed for electrically connecting the $N^+$ diffusion region 6 with a metal layer (not shown). On the salicidised surface of the gate electrode 9 too, contacts (not shown) are formed for electrically connecting the gate electrode 9 with the metal layer (not shown).

(Region A)

Figure 6:
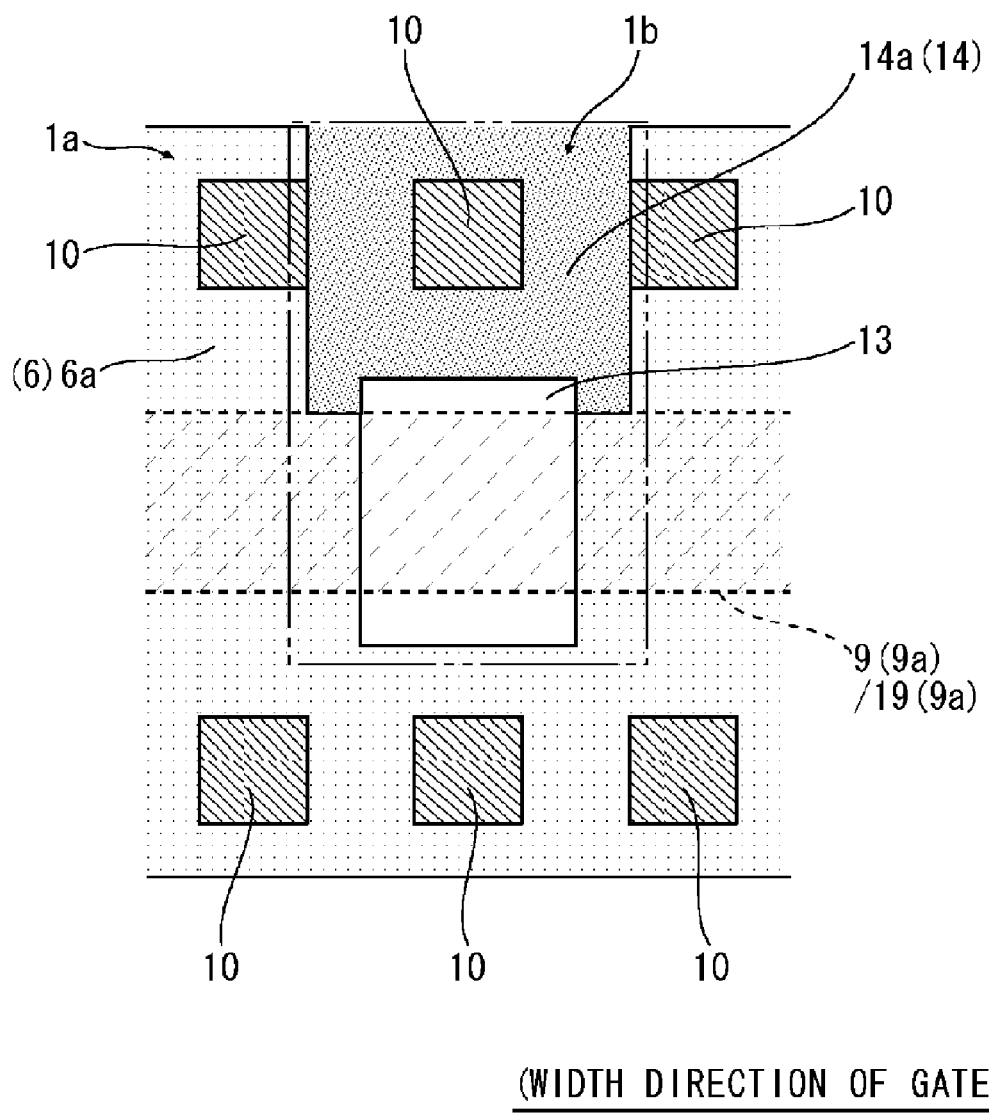
FIG. 6 is a close-up of a region A or B of the SOI-MOSFET device according to the first or second embodiment of the present invention.

Now, a structure of the channel contact region 1b according to the first embodiment will be described with reference to FIG. 6, which is a close-up of a region A indicated in FIG. 1. In this case, the region A is defined as a region including the channel contact region 1b and the surrounding area. In FIG. 6, note that the gate electrode 9 is shown by broken lines in order to show the structure of the channel contact region 1b in a more understandable way.

As shown in FIG. 6, the channel contact region 1b includes a $P^+$ diffusion region 14 and an insulation region 13. The $P^+$ diffusion region 14 is a region which divides one of the two portions of the $N^+$ diffusion region 6 in the MOSFET region 1a in the width direction of the gate, and it is formed in a way contacting the channel region 7. In other words, the $P^+$ diffusion region 14 is formed in a region that is adjacent to one of the two portions of the $N^+$ diffusion region 6 in the MOSFET region 1a in the width direction of the gate. The insulation region 13 is a region adjacent to the P⁺ diffusion region 14, and it is formed in a way which divides the channel region 7 in the width direction of the gate. The gate electrode 9 (shown by the broken line in FIG. 6) of the MOSFET region 1a extends over this insulation region 13.

The P⁺ diffusion region 14 functions as a wiring for electrically connecting the channel region 7 and the contact 10 on the P⁺ diffusion region 14. The electric charge (i.e. electron holes) that has accumulated in the channel region 7 flows into the P⁺ diffusion region 14 via the connecting portion between the channel region 7 and the P⁺ diffusion region 14, and can be drawn out to the outside through the contact 10 formed on the P⁺ diffusion region. Here, when drawing out from the channel contact region 1b the electron holes accumulated in the channel region 7, bias voltage is impressed between the source and drain (i.e. two portions of the N⁺ diffusion region 6).

The P⁺ diffusion region 14 and the N⁺ diffusion region 6 have the opposite conductivity. Therefore, the P⁺ diffusion region 14 (i.e. the wiring region) and the source/drain region (i.e. N⁺ diffusion region 6) are electrically separated. The P⁺ diffusion region 14 has the same conductivity as the channel region 7, and is a high concentrated diffusion layer as compared with the channel region. Therefore, the electric charge accumulated in the channel region 7 can smoothly flow into the P⁺ diffusion region 14.

Referring to FIG. 6, the insulation region 13 which is contained in the channel contact region 1b is made of the same insulating material as the element separation insulation film 4. In other words, the insulation region 13 is made of an oxidized silicon film or an oxidized film embedded in the groove which is formed within the active region. As shown in FIG. 6, this insulation region 13 is adjacent to the P⁺ diffusion region 14 in the longitudinal direction of the channel, and is formed in a way dividing the channel region 7 in the width direction of the gate. Due to this arrangement, it is possible to reduce the volume of the channel region 7, which is a region where electric charge is accumulated. As a result, it is made possible to minimize the Kink effect.

As shown in FIG. 6, the N⁺ diffusion region 6 of the MOSFET region 1a extends in the area on the opposite side of the P⁺ diffusion region 14, while the insulation region 13 lies in between the N⁺ diffusion region 6 and the P⁺ diffusion region 14. By this arrangement, it is possible to easily draw out the electric charge accumulated in the channel region 7 from the side of the P⁺ diffusion region 14, using a potential difference generated between the N⁺ diffusion region 6 and the P⁺ diffusion region 14.

Such channel contact region 1b having the above-described structure is set up periodically at every predetermined gate width, as can be seen in FIG. 1. By this arrangement, it is possible to draw out the electric charge accumulated in each channel region, and as a result, it is possible to prevent possible resistance fluctuation in the body part, and make the characteristics of the MOSFET uniform.

(Structure of II-II' Section)

Figure 3:
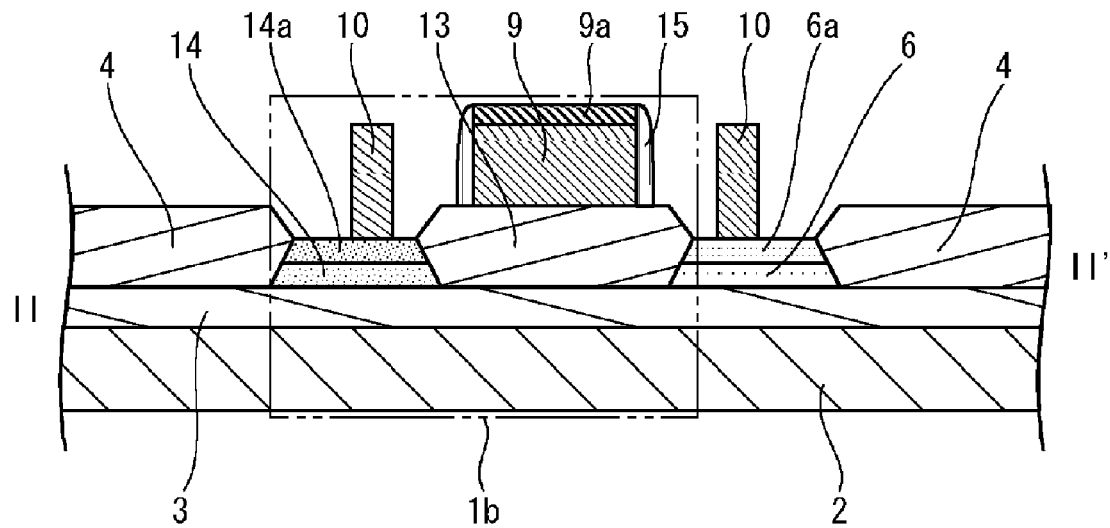
FIG. 3 is a sectional view showing a section II-II' of the SOI-MOSFET device according to the first embodiment of the present invention.

Next, the structure of the II-II' section indicated in FIG. 1 will be described with reference to FIG. 3. As shown in FIG. 3, in the structure of the II-II' section, i.e. the sectional structure of the channel contact region 1b, the P⁺ diffusion region 14 and the insulation region 13 are formed in the active region of the SOI substrate. In addition, the structure of the II-II' section includes the N⁺ diffusion region 6 of the MOSFET region 1a and the gate electrode 9. In this sectional structure of the channel contact region 1b, the P⁺ diffusion region 14 is formed in a place where the N⁺ diffusion region 6 in the MOSFET region 1a is supposed to be formed. This P⁺ diffusion region 14 region, as described above with reference to FIG. 1 and FIG. 6, is formed in a way dividing one of the two portions of the N⁺ diffusion region 6 in the MOSFET region 1a in the width direction of the gate. In other words, in the channel contact region 1b, one of the two portions of the N⁺ diffusion region 6 is replaced with the P⁺ diffusion region 14.

In the sectional structure of the channel contact region 1b shown in FIG. 3, the insulation region 13 is formed in a place where the channel region 7 in the MOSFET region 1a is supposed to be formed. This insulation region 13, as described with reference to FIG. 1 and FIG. 6, is formed in a way dividing the channel region 7 in the MOSFET region 1a in the with direction of the gate. In other words, in the channel contact region 1b, the channel region 7 in the MOSFET region 1a is replaced with the insulation region 13. On the insulation region 13, the gate electrode 9 is formed. On both sides of the gate electrode 9, which are parallel with the width direction of the gate, sidewalls 15 are formed.

In the sectional structure of the II-II', the N⁺ diffusion region 6 is located in the area on the opposite side of the P⁺ diffusion region 14 while the insulation region 13 lies in between the N⁺ diffusion region 6 and the P⁺ diffusion region 14. Silicide films 6a, 14a and 9a are formed on the surfaces of the N⁺ diffusion region 6, the P⁺ diffusion region 14 and the gate electrode 9, respectively. By salicidising the surfaces of the N⁺ diffusion region 6, the P⁺ diffusion region 14 and the gate electrode 9, the resistance at these portions can be decreased, and it will be possible to obtain favorable current characteristics. On the salicidised N⁺ diffusion region 6 and the P⁺ diffusion region 14, contacts 10 are formed, respectively, for electrically connecting the N⁺ diffusion region 6 and the P⁺ diffusion region 14 with a metal layer (not shown).

(Structure of III-III' Section)

Figure 4:
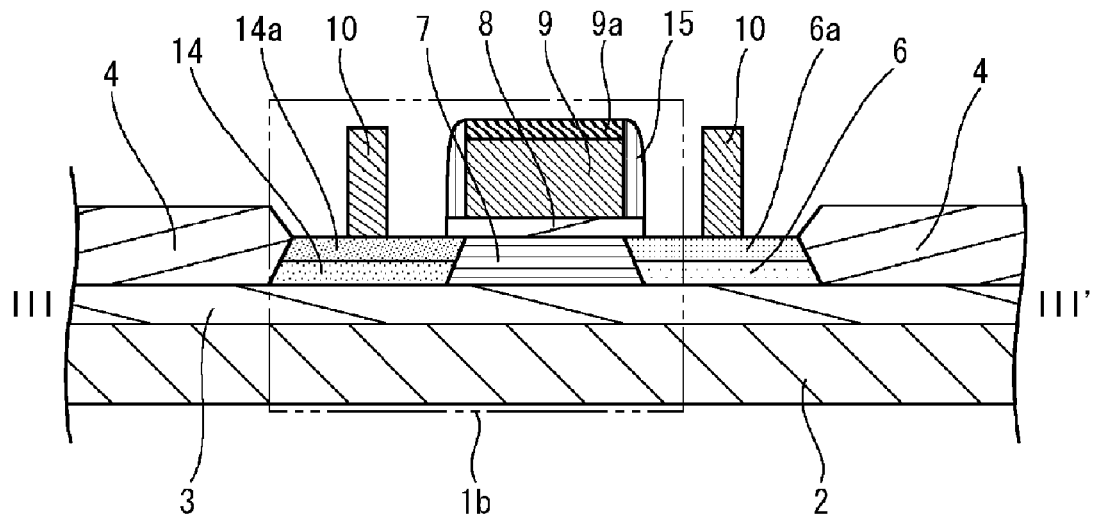
FIG. 4 is a sectional view showing a section II-II' of the SOI-MOSFET device according to the first embodiment of the present invention.

Next, the structure of the III-III' section indicated in FIG. 1 will be described with reference to FIG. 4. As shown in FIG. 4, in the structure of the III-III' section, i.e. the sectional structure of the channel contact region 1b in the vicinity of the MOSFET region 1a, the channel region 7 and the P⁺ diffusion region 14 are formed in the active region of the SOI substrate. In addition, the structure of the III-III' section includes the N⁺ diffusion region 6 of the MOSFET region 1a, the gate oxide film 8 and the gate electrode 9. In this sectional structure of the channel contact region 1b, the channel region 7 is an extended region of the channel region 7 in the MOSFET region 1a, and the P⁺ diffusion region 14 is a continuing region of the P⁺ diffusion region 14 shown in FIG. 3. On the channel region 7, the gate oxide film 8 is formed. On both sides of the gate electrode 9, which are parallel with the width direction of the gate, sidewalls 15 are formed.

As shown in FIG. 4, in the sectional structure of the III-III', the N⁺ diffusion region 6 is located in the area on the opposite side of the P⁺ diffusion region 14 while the channel region 7 lies in between the N⁺ diffusion region 6 and the P⁺ diffusion region 14. The silicide films 6a, 14a and 9a are formed on the surfaces of the N⁺ diffusion region 6, the P⁺ diffusion region 14 and the gate electrode 9, respectively. By salicidising the surfaces of the N⁺ diffusion region 6, the P⁺ diffusion region 14 and the gate electrode 9, the resistance at these portions can be decreased, and it will be possible to obtain favorable current characteristics. On the salicidised N⁺ diffusion region 6 and the P⁺ diffusion region 14, contacts 10 are formed, respectively, for electrically connecting the N⁺ diffusion region 6 and the P⁺ diffusion region 14 with the metal layer (not shown).

(Structure of IV-IV' Section)

Figure 5:
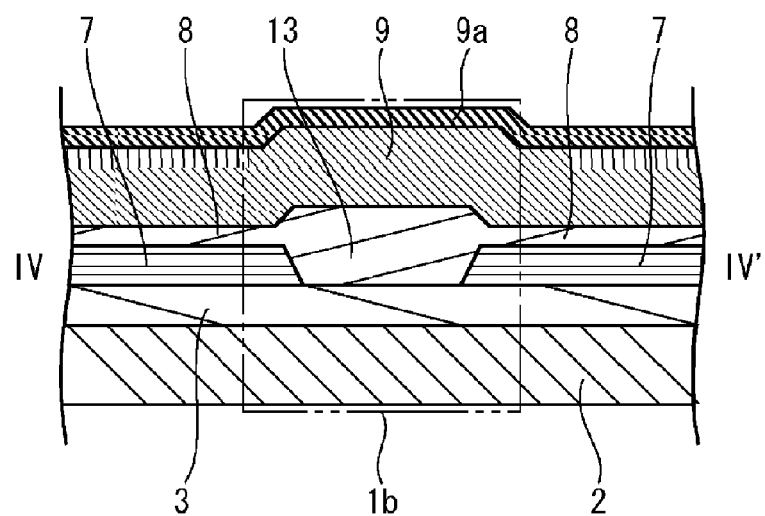
FIG. 5 is a sectional view showing a section IV-IV' of the SOI-MOSFET device according to the first embodiment of the present invention.

Next, the structure of the IV-IV' section indicated in FIG. 1 will be described with reference to FIG. 5. As shown in FIG. 5, in the structure of the IV-IV' section, i.e. the sectional structure of the channel contact region 1b in the surface which is vertical with the longitudinal direction of the channel, the channel region 7 and the insulation region 13 are formed in the active region of the SOI substrate. In addition, the structure of the IV-IV' section includes the channel region 7 of the MOSFET region 1a and the gate electrode 9. In this sectional structure of the channel contact region 1b, the channel region 7 is an extended region of the channel region 7 in the MOSFET region 1a. The insulation region 13, as described above with reference to FIG. 1 and FIG. 6, is formed in a way which divides the channel region 7 in the MOSFET region 1a in the width direction of the gate. On the insulation region 13, the gate electrode 9 is formed. On the gate electrode 9, as described with reference to FIG. 3 or FIG. 4, the salicide film 9a is formed and it contributes to decreasing the resistance at this portion.

As described above, in the SOI-MOSFET device 1 according to the first embodiment of the present invention, the $P^+$ diffusion region 14 is formed adjacent to one of the two portions of the $N^+$ diffusion region 6 in the MOSFET region 1a in the width direction of the gate, and it is formed such that at least a portion of it is in contact with (or superimposed on) the channel region 7. On this $P^+$ diffusion region 14 contacts 10 are formed. By these arrangements, the channel region 7 and the contacts 10 are electrically connected, and it is possible to draw out the electric charge (i.e. electron holes) that has accumulated in the channel region 7 from the contacts 10 via the $P^+$ diffusion region 14. As a result, it is possible to minimize the Kink effect, and obtain preferable characteristics.

Figure 7:
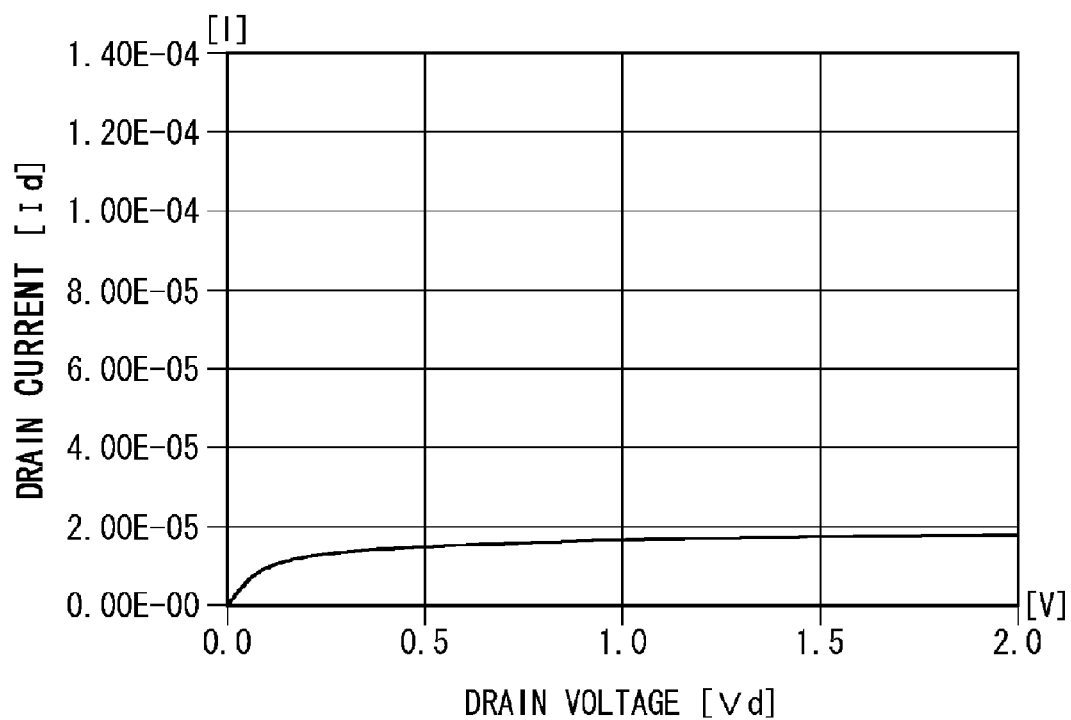
FIG. 7 is a graphical representation showing a voltage current characteristic (Vd-Id characteristic) of the SOI-MOSFET device according to the first embodiment of the present invention.

The voltage current characteristic (Vd-Id characteristic) of the SOI-MOSFET device 1 is shown in FIG. 7. In addition, the voltage current characteristic (Vd-Id characteristic) of an SOI-MOSFET device which does not have the channel contact region 1b according to the embodiment of the present invention is shown in FIG. 8.

Figure 8:
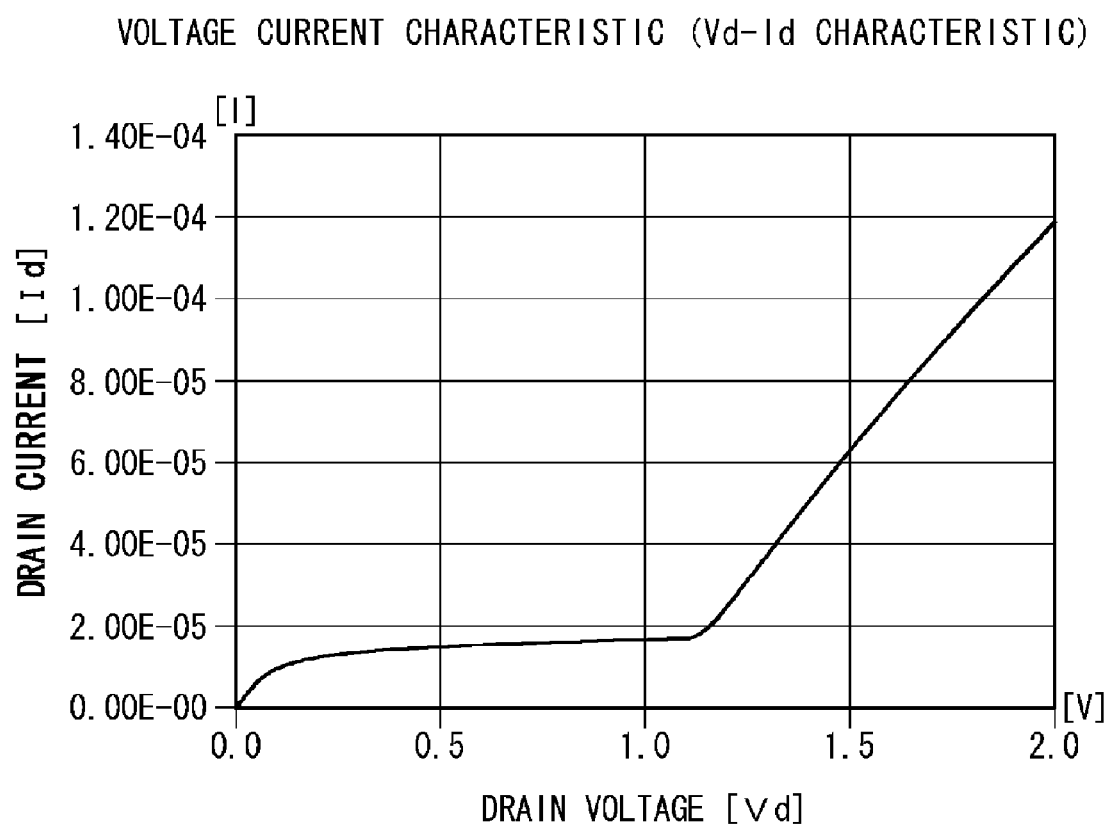
FIG. 8 is a graphical representation showing a voltage current characteristic (Vd-Id characteristic) of an SOI-MOSFET device which does not have a channel contact region according to the first embodiment of the present invention.

As it is obvious from comparing FIG. 7 and FIG. 8, in the SOI-MOSFET device which does not have the channel contact region 1b, the Kink effect, in which the drain current (Id) changes in a stepwise manner, is occurring when the drain voltage (Vd) reaches a certain point (i.e. a point where the drain voltage surpasses around 1.1 V in the example of FIG. 8). On the other hand, when referring to FIG. 7, it is obvious that the Kink effect is being controlled in the SOI-MOSFET device 1 of this embodiment. Therefore, in this embodiment of the present invention, preferable characteristics can be obtained.

Furthermore, in the SOI-MOSFET device 1 according to this embodiment of the present invention, the $P^+$ diffusion region 14, which functions as the wiring for drawing out electric charge from the channel region 7, is formed adjacent to the $N^+$ diffusion region 6 in the width direction of the gate. In other words, in this embodiment, the region which has conventionally been used as the $N^+$ diffusion region is used as the $P^+$ diffusion region 14. By this arrangement, the layout in the region which should be used as the $N^+$ diffusion region 6 as usual does not have to be changed. In addition, in this embodiment, the contacts which have conventionally been used as the contacts on the $N^+$ diffusion region can be used as the contacts (10) on the $P^+$ diffusion region 14. Therefore, the layout of the contacts (10) formed on the $N^+$ diffusion region 6 and the $P^+$ diffusion region 14 does not have to be changed. In other words, in this embodiment of the present invention, the layout and masks as used conventionally can be used almost without modification, and therefore, it is possible to keep necessary design changes to a minimum. As a result, it is possible to keep the design cost to a minimum as well. Moreover, since there is no need for reducing the number of contacts, it is possible to prevent possible influence which such reduction in the number of contacts can give to the current characteristics.

Furthermore, as shown by an additional part 100 in FIG. 1, by adding in the width direction of the gate, a channel region 7 and a corresponding $N^+$ diffusion region 6 having the same width as that in which the insulation region 13 in the channel contact region 1b is formed, it is possible to easily realize a MOSFET which has characteristics and functions equal to a conventional MOSFET.

Manufacturing Method

Next, a method of manufacturing the SOI-MOSFET device 1 according to this embodiment of the present invention will be described with reference to the drawings. FIG. 9 to FIG. 13 are sectional views showing the manufacturing processes of the SOI-MOSFET device 1. FIG. 9 and FIG. 11 show the I-I' section (q.v. FIG. 1) at each process, and FIG. 10 and FIG. 12 show the II-II' section (q.v. FIG. 1) at each process. FIG. 10 and FIG. 12 show different sectional structures from the ones shown in FIG. 9 and FIG. 11. FIG. 13 show the III-III' section (q.v. FIG. 1) at each process. FIG. 11 and FIG. 13 show different sectional structures from the ones shown in FIG. 9 to FIG. 12.

Figure 9A:
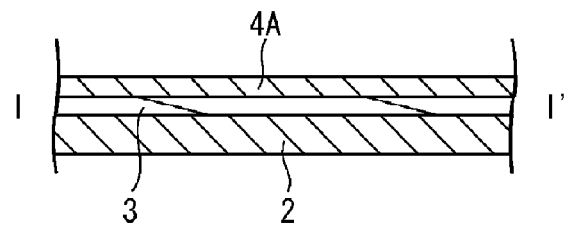
FIGS. 9A to 13C are process diagrams showing the manufacturing steps in a manufacturing method of the SOI-MOSFET device according to the first embodiment of the present invention.
Figure 9B:
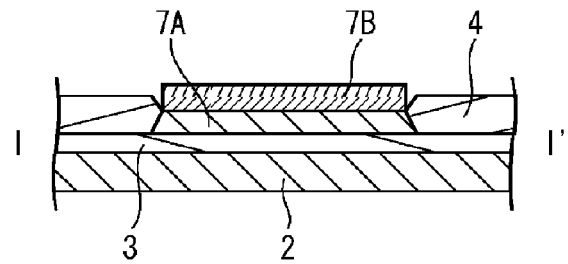

As shown in FIG. 9A, according to the manufacturing method of this embodiment, an SOI substrate where a support substrate 2 is laminated sequentially with an buried oxide film 3 and a silicon film 4A is used. A P type silicon substrate is used as the support substrate 2. As for the buried oxide film 3, for instance, an oxide silicon ($SiO_2$) film etc. with a thickness of 100 to 200 nm (nanometer) can be used. As for the silicon film 4A, it can be a film with a thickness of 50 nm, for example. The above figures are given just as examples, and can be changed in the present invention. The SOI can be defined as a partially depleted SOI (hereinafter to be referred to as PD-SOI) or a fully depleted SOI (hereinafter to be referred to as FD-SOI) depending on the thickness of the SOI layer (i.e. the silicon film 4A). However, the present invention can provide the expected advantages regardless of whether the SOI is a PD-SOI or an FD-SOI.

Figure 10A:
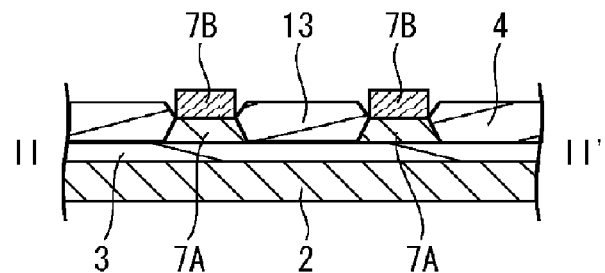

In the SOI substrate, a nitride film (a silicon nitride (SiN) film) 7B in this case) with a predetermined pattern is formed on an element formation region 7A. Using this nitride film as a mask, the exposed silicon film 4A is oxidized to form an element separation insulation film 4. The remaining non-oxidized region, i.e. the region underneath the SiN layer 7B, becomes the element formation region 7A. The predetermined pattern as just mentioned is a pattern for covering over an $N^+$ diffusion region 6 and a $P^+$ diffusion region 14 shown in FIG. 1, and it is opened at the upper part of an insulation region 13. Therefore, as shown in FIG. 10A, the insulation region 13 is formed by oxidizing the silicon layer 4A while using the SiN layer 7B as a mask. In other words, in addition to the element separation insulation film 4 being a field region, the insulation region 13 is formed in a region which is adjacent to the $P^+$ diffusion region 14 and which divides a channel region 7 in the width direction of the gate. After the insulation region 13 is formed, the SiN layer 7B is removed.

Figure 9C:
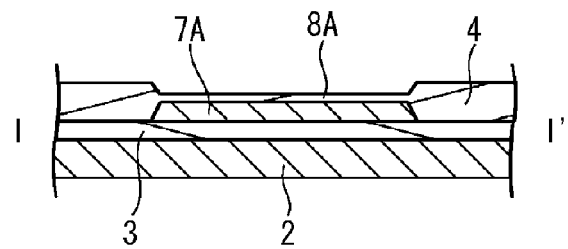
Figure 10B:
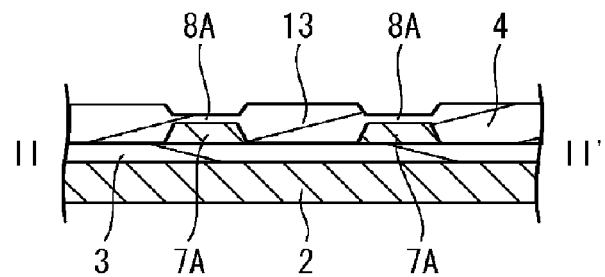

Next, as shown in FIG. 9C and FIG. 10B, by oxidizing the exposed surface of the element formation region 7A, a gate oxide film 8A is formed on the surface of the element formation region 7A, i.e. on a region which turns into the $N^+$ diffusion region 6, the channel region 7 and the $P^+$ diffusion region 14. In this case, for instance, the gate oxide film 8A is 2.5 nm thick.

Figure 9D:
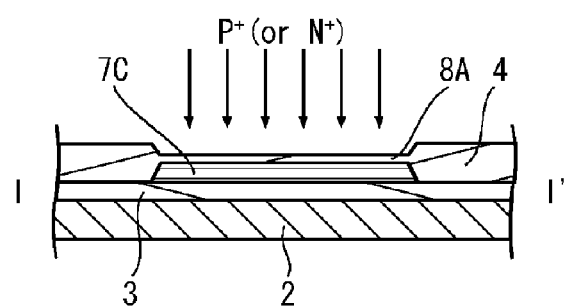
Figure 10C:
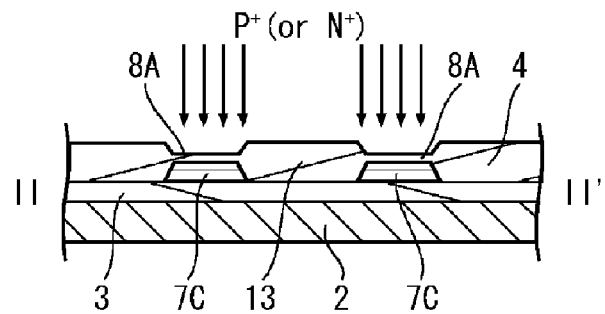

Next as shown in FIG. 9D and FIG. 10C, ion is implanted into the element formation region 7A for the purpose of adjusting a threshold value of the element formation region 7A. Through this process, a diffusion region 7C is formed. Since this embodiment shows an example of the N-MOSFET, in this process, positive ions (P⁺) are implanted such that the dose amount becomes about $1\times10^{12}$ to $3\times10^{12}/cm^2$, for instance. As for the positive ion, for example, boron difluoride ion (BF₂⁺) etc. can be used.

However, in manufacturing an SOI-MOSFET device where an N-MOSFET and a P-MOSFET are combined, the process described with reference to FIG. 9D and FIG. 10C should be divided into a process of adjusting a threshold value of the element formation region 7A in an N-MOSFET formation region (which is to be considered as an NMOS threshold adjusting process) and a process of adjusting a threshold value of the element formation region 7A in a P-MOSFET formation region (which is to be considered as a PMOS threshold adjusting process). In more concrete terms, in the NMOS threshold adjusting process, the P-MOSFET formation region is masked to prevent positive ion (P⁺) from entering into the element formation region 7A in the P-MOSFET region, and then the positive ion (P⁺) is implanted into the exposed element formation region 7A such that the dose amount of the positive ion (P⁺) becomes about $1\times10^{12}$ to $3\times10^{12}/cm^2$, for instance. On the other hand, in the PMOS threshold adjusting process, the N-MOSFET formation region is masked to prevent positive ion (N⁺) from entering into the element formation region 7A in the N-MOSFET region, and then the negative ion (N⁺) is implanted into the exposed element formation region 7A such that the dose amount of the negative ion (N⁺) becomes about $1\times10^{12}$ to $3\times10^{12}/cm^2$, for instance. As for the positive ion, for instance, boron difluoride (BF₂⁺) ion etc. can be used, as mentioned above. As for the negative ion, for instance, phosphorous ion (P⁺) etc. can be used. The mask used in each of the above processes is removed after each threshold value is adjusted.

Figure 9E:
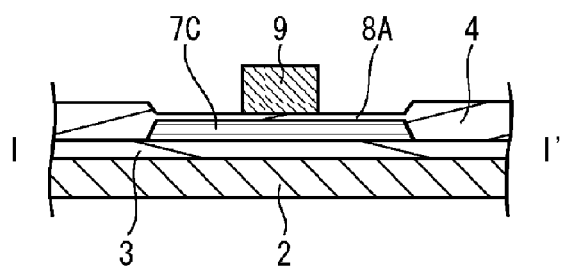
Figure 10D:
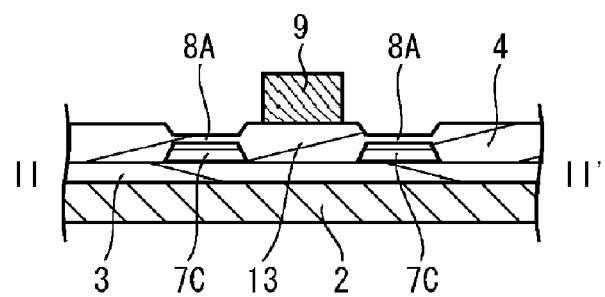

In the above described manner, the diffusion region 7C having its threshold adjusted by the ion implantation into the element formation region 7A is formed. Then, as shown in FIG. 9E and FIG. 10D, a continuing gate electrode 9 (q.v. FIG. 1) is formed on the gate oxide film 8A and the insulation region 13. As shown in FIG. 1, this gate electrode 9 is formed in a way overstriding the MOSFET region 1a and the channel contact region 1b which are disposed in the width direction of the gate. In more concrete terms, first, a polysilicon layer with a thickness of 100 nm, for instance, is formed on the wafer using a CVD method, etc. After that, a resist in which the pattern of the gate electrode 9 is being opened is formed on the polysilicon layer using a photolithography method. Then using this resist as a mask, the polysilicon layer is etched. Through these processes, the gate electrode 9 made of polysilicon is formed.

Figure 11A:
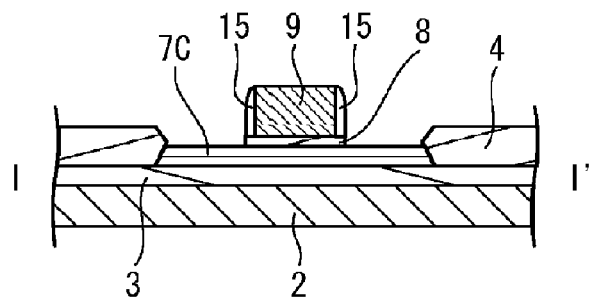
Figure 12A:
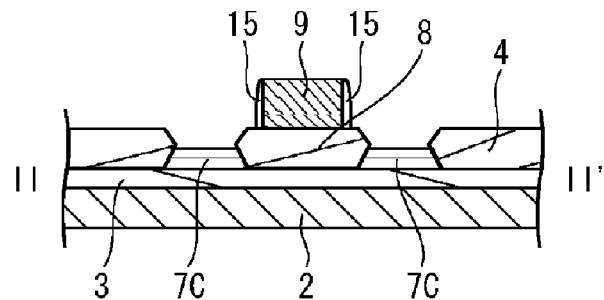

Next, as shown in FIGS. 11A and 12A, sidewalls 15 are formed on the sides of the gate electrode 9 (i.e. on the surfaces which are parallel with the width direction of the gate). The sidewalls 15, for instance, can be formed by first forming a nitride film (e.g. a SiN film) using the CVD method, and then etching the nitride film. In this etching process, the gate oxide film 8A on the diffusion region 7C, but except for the part underneath the gate electrode 9 and the sidewalls 15, should also be etched. Through this process, the diffusion region 7C where the N⁺ diffusion region 6 and the P⁺ diffusion region 14 are supposed to be formed, are opened.

Figure 11B:
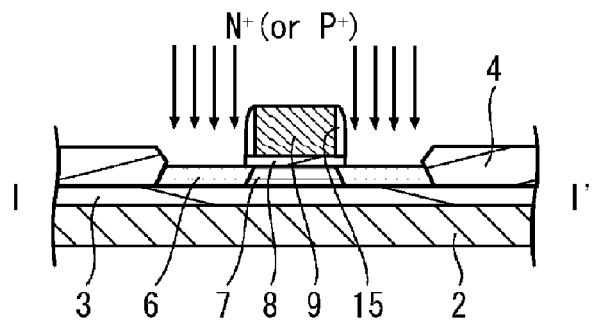
Figure 12B:
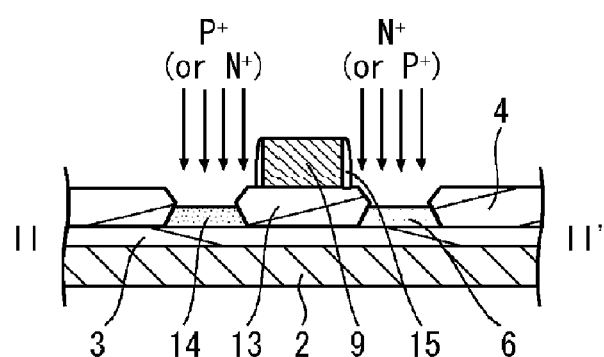
Figure 13A:
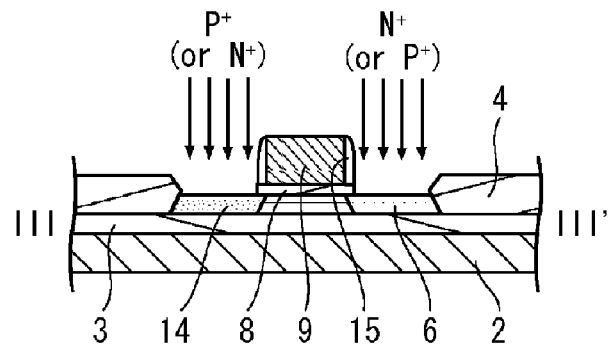

Next, as shown in FIG. 11B, FIG. 12B and FIG. 13A, while using the gate electrode 9, the sidewalls 15 and the element separation oxide film 4 as a mask, negative ions (N⁺) are implanted into the diffusion region 7C where the N⁺ diffusion region 6 is supposed to be formed, and then positive ions (P⁺) are implanted into the diffusion region 7C where the P⁺ diffusion region 14 is supposed to be formed. With respect to this particular embodiment, the negative ions (N⁺) are implanted into the diffusion region 7C where the N⁺ diffusion region 6 is supposed to be formed such that the dose amount becomes about $1\times10^{15}$ to $5\times10^{15}/cm^2$, for instance. As for the negative ion, for example, phosphorous ion (P⁺) etc. can be used. On the other hand, the positive ion (P⁺) is implanted into the diffusion region 7C where the P⁺ diffusion region 14 is supposed to be formed such that the dose amount becomes about $1\times10^{15}$ to $5\times10^{15}/cm^2$, for instance. As for the positive ion, for example, boron difluoride (BF₂⁺) ion etc. can be used.

However, in manufacturing an SOI-MOSFET device where an N-MOSFET and a P-MOSFET are combined, the process described with reference to FIG. 11B, FIG. 12B and FIG. 13A should be divided into a process of implanting negative ion (N⁺) (which is to be considered as an N⁺ diffusion process) and a process of implanting positive ion (P⁺) (which is to be considered as a P⁺ diffusion process). In more concrete terms, when executing the N⁺ diffusion process before the P⁺ diffusion process, in this N⁺ diffusion process, a predetermined P⁺ diffusion region in the N-MOSFET formation region and a predetermined P⁺ diffusion region in the P-MOSFET formation region are masked to prevent the negative ion (N⁺) from entering thereto, and then the negative ion (N⁺) is implanted into the exposed diffusion region 7C such that the dose amount of the negative ion (N⁺) becomes about $1\times10^{12}$ to $3\times10^{12}/cm^2$, for instance. On the other hand, in the P⁺ diffusion process, an N⁺ diffusion region in the N-MOSFET formation region and an N⁺ diffusion region in the P-MOSFET formation region are masked to prevent the positive ion (P⁺) from entering thereto, and then the positive ion (P⁺) is implanted into the exposed diffusion region 7C such that the dose amount of the positive ion (P⁺) becomes about $1\times10^{12}$ to $3\times10^{12}/cm^2$, for instance. As for the negative ion, for instance, phosphorous ion (P⁺) etc. can be used, and as for the positive ion, for instance, boron difluoride (BF₂⁺) ion etc. can be used. The mask used in each of the above processes is removed after each ion implantation is finished.

Figure 11C:
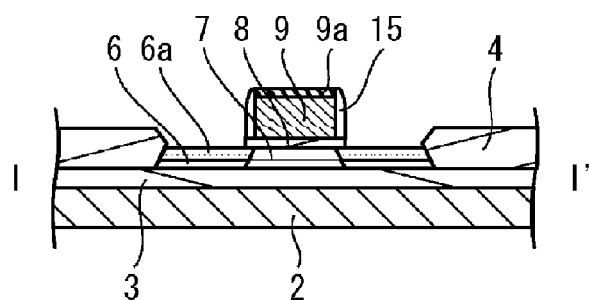
Figure 12C:
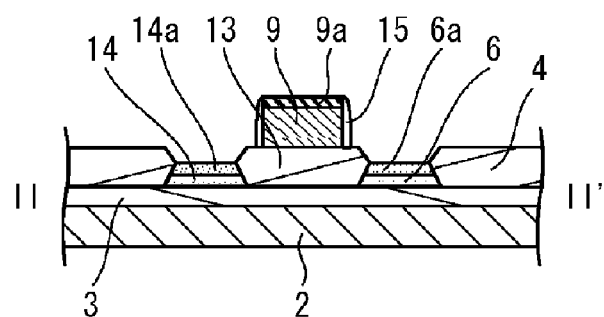
Figure 13B:
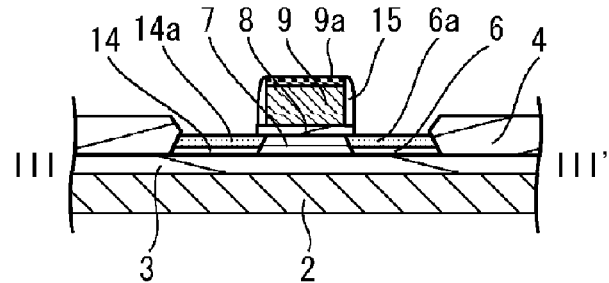

After forming the N⁺ diffusion region 6 and the P⁺ diffusion region 14 are formed in the above-described manner, the surfaces of the N⁺ diffusion region, the P⁺ diffusion region 14 and the gate electrode 9 are silicidised to form silicide films 6a, 14a and 9a, respectively, as shown in FIG. 11C, FIG. 12C, and FIG. 13B. In more concrete terms, cobalt (Co) film, for instance, is formed on the entire surface of the wafer, and then heat-treated. By this process, the silicon (Si) and the cobalt (Co) react to each other to become CoSi2 (i.e. salicidised). The cobalt (Co) which did not react is removed by selective etching.

Figure 11D:
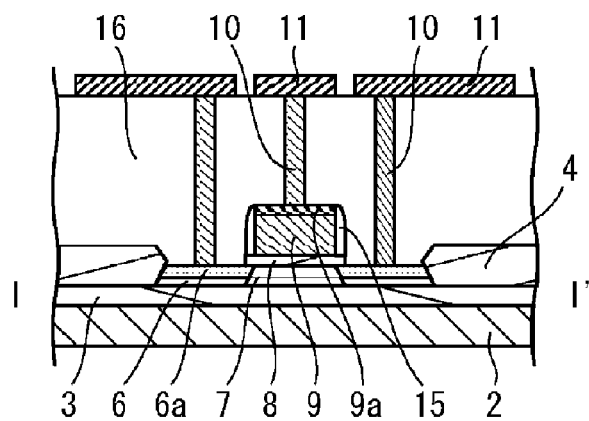
Figure 12D:
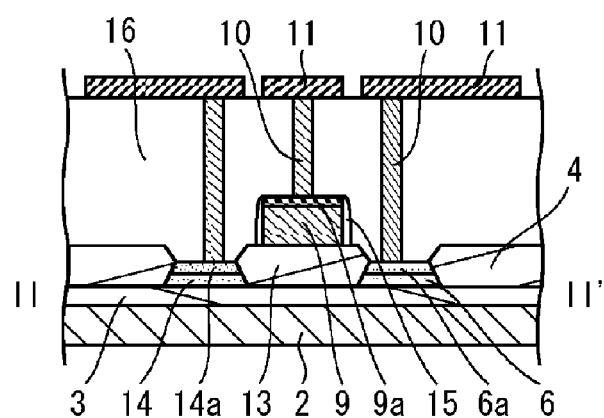
Figure 13C:
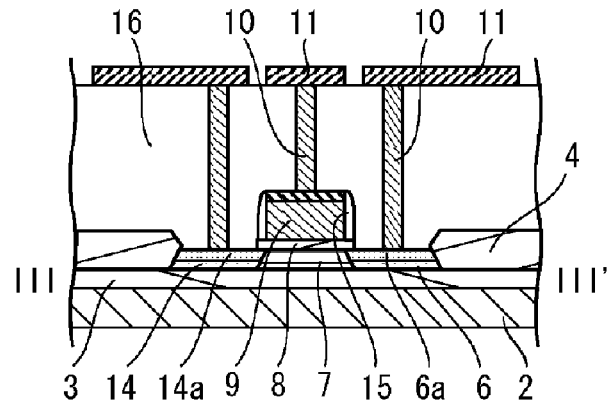

Finally, as shown in FIG. 11D, FIG. 12D and FIG. 13C, an inter-layer insulation film (e.g. an SiO₂ film) 16 is formed on the element having being formed, and then contact holes are opened in this inter-layer insulation film 16 over the N⁺ diffusion region 6, the P⁺ diffusion region 14 and the gate electrode 9, using a known photolithography method and etching method. Then, the contact holes are filled up with tungsten (W) by a sputtering method or the CVD method for instance, by which contacts 10 are formed. After that, metals 11 are formed on the inter-layer insulation film 16. By these processes, electric conduction is made possible among the N⁺ diffusion region 6, the P⁺ diffusion region 14 and the gate electrode 9.

As described above, in the method of manufacturing the SOI-MOSFET device 1 according to the first embodiment of the present invention, the P⁺ diffusion region 14, which functions as a wiring region for drawing out the accumulated electric charge (electron holes) in the channel region 7, is formed in a region which contacts with the channel region 7. Therefore, by this manufacturing method, a structure where the accumulated electric charge in the channel region can be drawn out easily is made possible. As a result, it is possible to manufacture an SOI-MOSFET device which is capable of minimizing the Kink effect, and obtain preferable characteristics. Furthermore, conventionally, the region adjacent to one of the two portions of the $N^+$ diffusion region 6 in the MOSFET region 1a in the width direction of the gate has usually been used as an $N^+$ diffusion region. In the manufacturing method according to this embodiment, the $P^+$ diffusion region 14 is formed in this region, and by this arrangement, the layout in the region which should be used as the $N^+$ diffusion region 6 as usual does not have to be changed. In addition, in the manufacturing method according to this embodiment, the contacts which have conventionally been used as the contacts on the $N^+$ diffusion region can be formed as the contacts (10) on the $P^+$ diffusion region 14. Therefore, the layout of the contacts (10) formed on the $N^+$ diffusion region 6 and the $P^+$ diffusion region 14 does not have to be changed. In other words, in the manufacturing method according to this embodiment, the layout and masks as used conventionally can be used almost without modifications, and therefore, it is possible to keep necessary design changes to a minimum. As a result, it is possible to keep the design cost to a minimum as well. Moreover, in the manufacturing method according to this embodiment, since there is no need for reducing the number of contacts, it is possible to manufacture an SOI-MOSFET device which is capable of preventing possible influence in which such reduction in the number of contacts can give to the current characteristics. Furthermore, in the manufacturing method according to this embodiment, since the channel contact region 1b including the $P^+$ diffusion region 14 is formed inside the MOSFET region 1a (or between MOSFETs) it is not necessary to have any hourglass portions or extended regions, which have usually been necessary. Accordingly, it is possible to keep possible increases in the mounting area on the substrate to a minimum.

Figure 14:
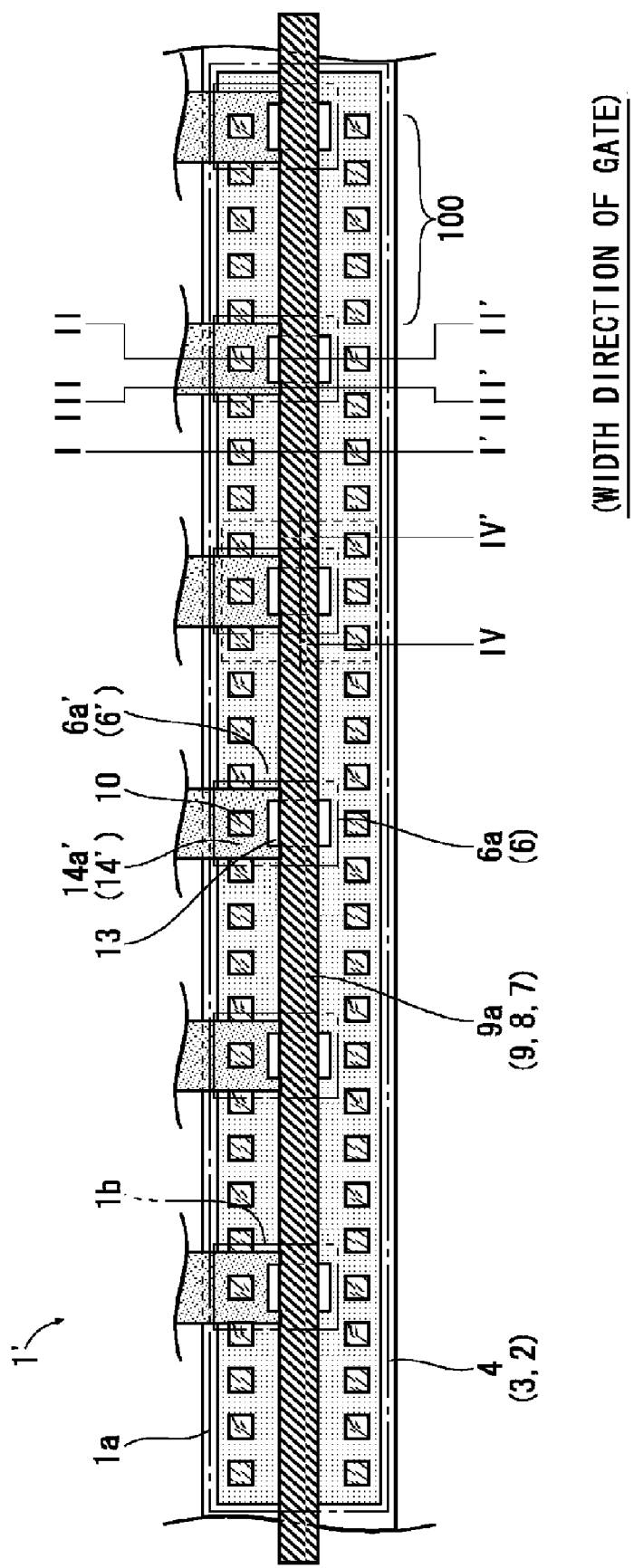
FIG. 14 is a diagram showing a structure of another SOI-MOSFET device according to the first embodiment of the present invention.

Although the above description mainly referrers to a case where the N-MOSFET is formed on the SOI substrate, the present invention is not limited to this case. For instance, the N-MOSFET can be replaced with a P-MOSFET. An SOI-MOSFET device 1' of such a case is shown in FIG. 14. As shown in FIG. 14, the $N^+$ diffusion region 6 and the salicide film 6a are replaced with a $P^+$ diffusion region 6' and a salicide film 6a', respectively, and the $P^+$ diffusion region 14 and the salicide film 14a are replaced with an $N^+$ diffusion region 14' and a salicide film 14a' having an opposite conductivity, respectively. In this case, the accumulated electric charge in the channel region 7 will not be electron holes but electrons.

Although specific materials and film thicknesses etc. are mentioned in the above description, such terms and figures are provided for illustrative purpose only. Accordingly, it is to be understood that the present invention is not limited to such specific terms and figures, and changes and variations can be made.

Moreover, although this embodiment has been described while taking the structure in which the channel contact region 1b is incorporated inside the MOSFET region 1a as an example, the present invention is not limited to such arrangement. For example, it is also possible to have a structure in which there are a plurality of MOSFETs being disposed in a line in the width direction of the gate and the channel contact region 1b is disposed between each MOSFET.

Second Embodiment

Next, a second embodiment of the present invention will be described with reference to the drawings. In addition, in the following, as for the structure that are the same with the first embodiment, the same reference numbers will be used, and redundant explanations of those structure elements will be omitted.

In this embodiment, an interdigital SOI-MOSFET device 1A, which has a gate electrode with an interdigital shape and N-MOSFET structures (element structures) formed along each finger of the gate electrode, will be described as an example. Here, the N(P)-MOSFET structure means a basic structure of N(P)-MOSFET, and the finger means one protrusion of the gate electrode. In the following, the gate electrode with the interdigital shape will be referred to as an interdigital gate electrode.

Structure

Figure 15:
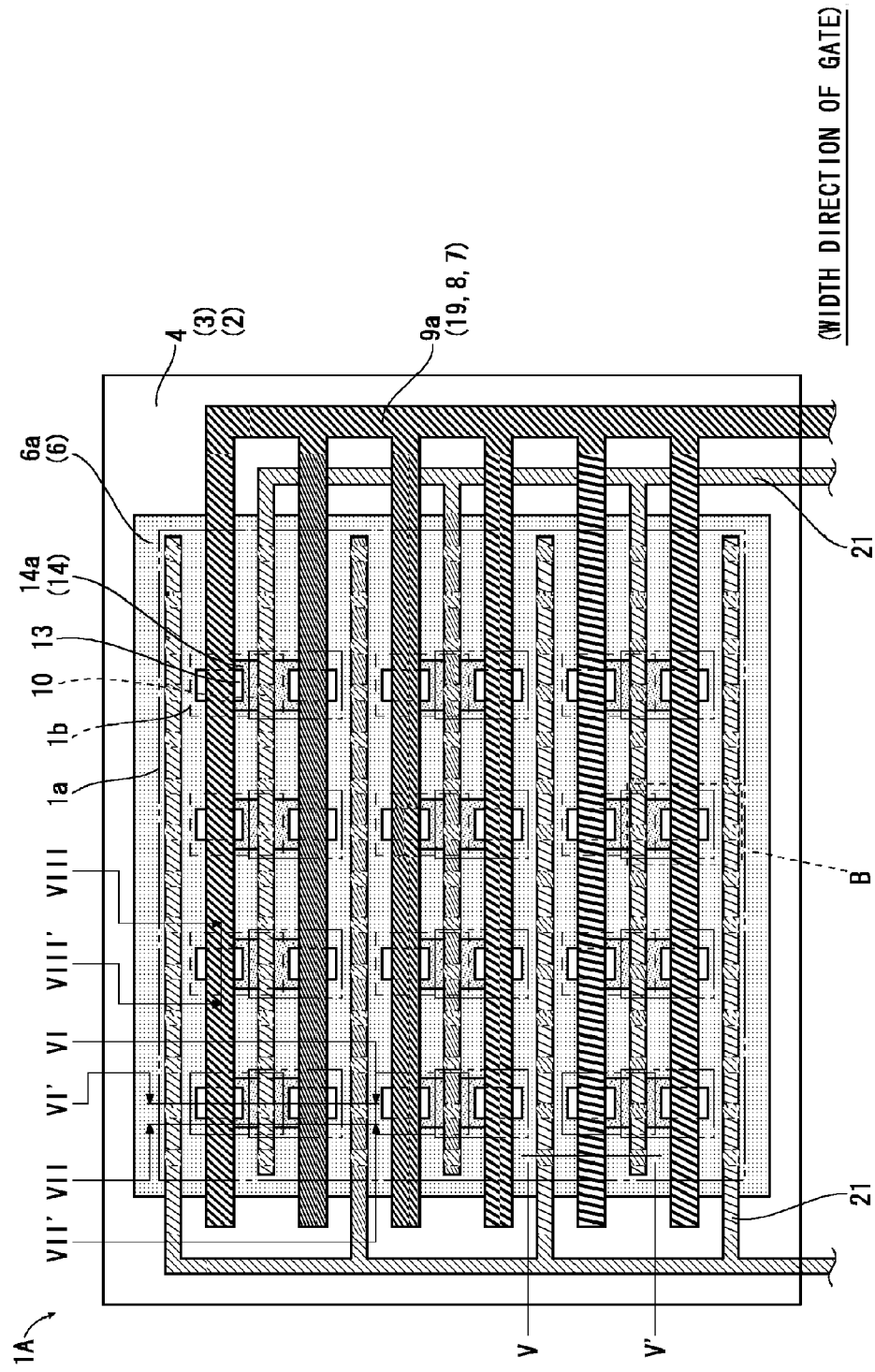
FIG. 15 is a diagram showing a structure of an interdigital SOI-MOSFET device according to a second embodiment of the present invention.

FIG. 15 is a diagram showing a structure of an interdigital SOI-MOSFET device 1A according to the second embodiment of the present invention. Note that FIG. 15 does not show the entire structure but only a portion of the MOSFET in an SOI wafer in order to make the following explanation simple. FIG. 16 to FIG. 19 show the structures of sections V-V', VI-VI', VII-VII', VIII-VIII' indicated in FIG. 15. The section V-V' is a section in the vicinity of the center of a MOSFET region 1a when cut at a surface which is perpendicular to the width direction of the gate. The section VI-VI' is a section in the vicinity of the center of a channel contact region 1b when cut at a surface which is perpendicular to the width direction of the gate. The section VII-VIII' is a section in the channel contact region 1b on the side of the MOSFET region 1a when cut at a surface which is perpendicular to the width direction of the gate. The section VIII-VIII' is a section in an insulation region 13 of the channel contact region 1b when cut at a surface which is perpendicular to the width direction of the gate.

As shown in FIG. 15 to FIG. 19, the interdigital SOI-MOSFET device 1A has a structure in which two or more MOSFET regions 1a and the channel contact regions 1b are formed in an active region of an SOI substrate. The SOI substrate has a structure in which the support substrate 2 is laminated sequentially with an buried oxide film 3 and a silicon film. In this particular embodiment of the invention, a structure in which the channel contact regions 1b are incorporated inside the MOSFET region 1a is applied as an example. In this structure, as shown in FIG. 15, the $P^+$ diffusion regions 14 of the channel contact regions 1b are respectively disposed at locations which each divide the $N^+$ diffusion region 6, which exists along each channel contact region 1b, in the width direction of the gate. A region in the silicon film of the SOI substrate where elements are not formed (i.e. a field region) is either oxidized or have a groove formed therein in which an insulating substance is to be buried. By this arrangement, as shown in FIG. 15, an element separation insulation film 4 for blocking electrical connections between/among elements is formed.

The MOSFET region 1a mainly consists of the channel region 7, an interdigital gate electrode 9 and the $N^+$ diffusion region 6. The interdigital gate electrode has two or more fingers. As shown in FIG. 15, each finger of the interdigital gate electrode 19 is formed on the channel region 7 and continuously along the channel region 7. Here, the fingers of the interdigital gate electrode 19 should not be divided by the channel contact region 1*b*. As shown in FIG. 15, the two portions of the N⁺ diffusion region 6 are formed along the channel region 7 such that they sandwich the channel region 7. Here one of the two portions of the N⁺ diffusion region 6 is divided by the channel contact region 1*b*. The N⁺ diffusion region 6 formed between portions of two fingers which adjoin in the length of the interdigital gate electrode 19 is shared by the two N-MOSFET structures which are formed along the two fingers adjoining in the length direction of the gate, the length direction of the gate being an orthogonal oriented direction with respect to the width direction of the gate. Thereby, it is possible to reduce an element mounting area.

(Structure of V-V' Section)

Figure 16:
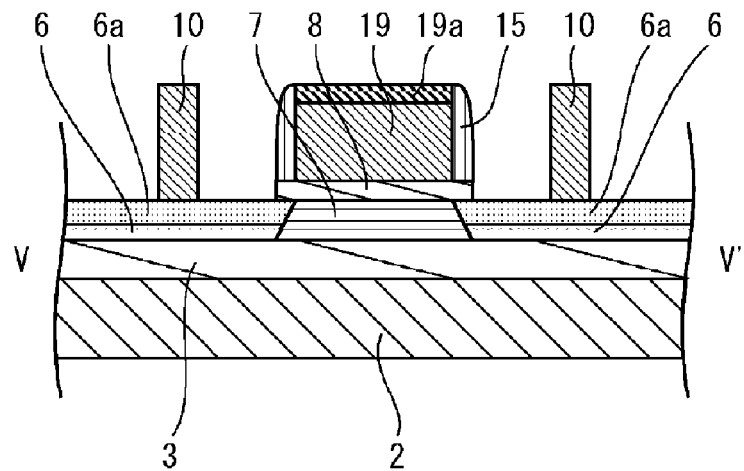
FIG. 16 is a sectional view showing a section V-V' of the interdigital SOI-MOSFET device according to the second embodiment of the present invention.

Now a structure of a section taken along V-V' indicated in FIG. 15 will be described with reference to FIG. 16. As shown in FIG. 16, the structure of the V-V' section of the MOSFET is the same as the structure shown in FIG. 2 in the first embodiment of the present invention, expect that the gate electrode 9 is replaced with an interdigital gate electrode 19 in this embodiment. That is, as shown in FIG. 16, the MOSFET includes the channel region 7, two portions of the N⁺ diffusion region 6, a gate oxide film 8 and the interdigital gate electrode 19, all formed in the active region of the SOI substrate.

As shown in FIG. 16, the two portions of the N⁺ diffusion region 6 are the source and drain regions, and they are formed in a way which sandwich the channel region 7. The N⁺ diffusion region 6 is doped with N type impurities in high concentration and has N type conductivity. On the other hand, the channel region 7 is doped with P type impurities in lower concentration as compared with the N⁺ diffusion region 6 and has P type conductivity.

As shown in FIG. 16, the gate oxide film 8 is formed in between the channel region and the interdigital gate electrode 19. On both sides of each finger of the interdigital gate electrode 19, which are parallel with the width direction of the gate, side walls 15 are formed, respectively. On the surfaces of the N⁺ diffusion region 6 and the interfigital gate electrode 19, salicide films 6*a* and 9*a* are formed, respectively. By salicidising the surfaces of the N⁺ diffusion region 6 and the interdigital gate electrode 19, the resistance at these portions can be decreased, and it is made possible to obtain favorable current characteristics. On the salicidised surface of the N⁺ diffusion region 6, contacts 10 are formed for electrically connecting the N⁺ diffusion region 6 with a metal layer (not shown). On the salicidised surface of the interdigital gate electrode 19 too, contacts (not shown) are formed for electrically connecting the interdigital gate electrode 19 with the metal layer (not shown).

(Region B)

As shown in FIG. 15, as with the first embodiment, the channel contact region 1*b* according to the second embodiment includes a P⁺ diffusion region 14 and an insulation region 13. The figure of the close-up of a region B is the same as the figure of the close-up of the region A shown in FIG. 6 of the first embodiment. Accordingly, in this embodiment, FIG. 6 will be referenced referred for explaining the structure of the region B.

As shown in FIG. 6, the P⁺ diffusion region 14 is a region which divides one of the two portions of the N⁺ diffusion region 6 in the MOSFET region 1*a*, which is formed at each finger of the interdigital gate electrode 19, in the width direction of the gate, and it is formed in a way contacting the channel region 7. In other words, the P⁺ diffusion region 14 is formed in a region that is adjacent to one of the two portions of the N⁺ diffusion region 6 in each MOSFET region 1*a* in the width direction of the gate. The insulation region 13 is a region adjacent to the P⁺ diffusion region 14, and it is formed in a way which divides the channel region 7, which corresponds with each finger of the interdigital gate electrode 19, in the width direction of the gate. The interdigital gate electrode 19 (shown by broken line in FIG. 6) of the MOSFET region 1*a* extends over this insulation region 13.

The P⁺ diffusion region 14 functions as a wiring for electrically connecting each channel region 7 and the contact 10 on the P⁺ diffusion region 14. The electric charge (i.e. electron holes) that has accumulated in the channel region 7 flows into the P⁺ diffusion region 14 via the connecting portion between the channel region 7 and the P⁺ diffusion region 14, and can be drawn out to the outside through the contact 10 formed on the P⁺ diffusion region. Here, when drawing out from the channel contact region 1*b* the electron holes accumulated in the channel region 7, bias voltage is impressed between the source and drain (i.e. two portions of the N⁺ diffusion region 6).

The P⁺ diffusion region 14 and the N⁺ diffusion region 6 have the opposite conductivity. Therefore, the P⁺ diffusion region 14 (i.e. the wiring region) and the source/drain region (i.e. N⁺ diffusion region 6) are electrically separated. The P⁺ diffusion region 14 has the same conductivity as the channel region 7, and is a high concentrated diffusion layer as compared with the channel region. Therefore, the electric charge accumulated in the channel region 7 can smoothly flow into the P⁺ diffusion region 14.

Referring to FIG. 6, the insulation region 13 which is contained in the channel contact region 1*b* is made of the same insulating material as the element separation insulation film 4. In other words, the insulation region 13 is made of an oxidized silicon film or an oxidized film embedded in the groove which is formed within the active region. As shown in FIG. 6, this insulation region 13 is adjacent to the P⁺ diffusion region 14 in the longitudinal direction of the channel, and is formed in a way dividing each the channel region 7 in the width direction of the gate. Due to this arrangement, it is possible to reduce the volume of the channel region 7, which is a region where electric charge is accumulated. As a result, it is made possible to minimize the Kink effect.

As shown in FIG. 6, the N⁺ diffusion region 6 of the MOSFET region 1*a* extends in the area on the opposite side of the P⁺ diffusion region 14 while the insulation region 13 lies in between the N⁺ diffusion region 6 and the P⁺ diffusion region 14. By this arrangement, it is possible to easily draw out the electric charge accumulated in the channel region 7 from the side of the P⁺ diffusion region 14, using a potential difference generated between the N⁺ diffusion region 6 and the P⁺ diffusion region 14.

Such channel contact region 1*b* having the above-described structure is set up periodically at every predetermined gate width in each finger of the interdigital gate electrode 19, as can be seen in FIG. 15. By this arrangement, it is possible to draw out the electric charge accumulated in each channel region, and as a result, it is possible to prevent possible resistance fluctuation in the body part, and make the characteristics of the MOSFET uniform.

(Structure of VI-VI' Section)

Figure 17:
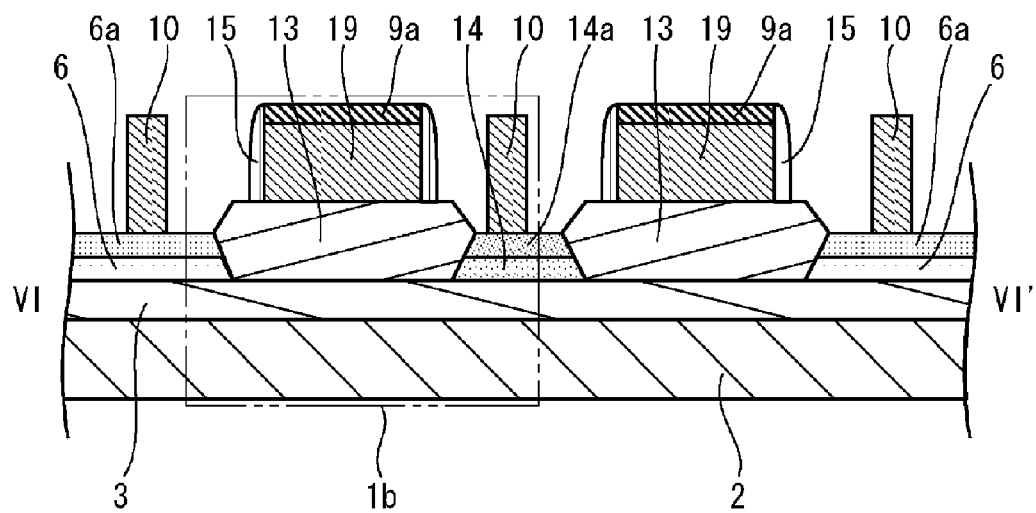
FIG. 17 is a sectional view showing a section VI-VI' of the interdigital SOI-MOSFET device according to the second embodiment of the present invention.

Next, the structure of the VI-VI' section indicated in FIG. 15 will be described with reference to FIG. 17. As shown in FIG. 17, the structure of the VI-VI' section, i.e. the sectional structure of the channel contact region 1*b* in each finger of the interdigital gate electrode 19, is the same with the structure of the II-II' section shown in FIG. 3 in the first embodiment. However, between the channel contact regions 1*b* adjoining in the length direction of the gate, the P⁺ diffusion region 14 which continues so that each channel contact regions 1*b* may be straddled is formed. Specifically, in the structure of the VI-VI' section in FIG. 15, the P+ diffusion region 14 and the insulation region 13 are formed in the active region of the SOI substrate. In addition, the structure of the VI-VI' section includes the N+ diffusion region 6 of the MOSFET region 1a and the interdigital gate electrode 19. In this sectional structure of the channel contact region 1b, the P+ diffusion region 14 is formed in a place where the N+ diffusion region 6 in the MOSFET region 1a is supposed to be formed. This P+ diffusion region 14 region, as described above with reference to FIG. 15 and FIG. 6, is formed in a way dividing one of the two portions of the N+ diffusion region 6 in the MOSFET region 1a of each finger in the width direction of the gate. In other words, in the channel contact region 1b, one of the two portions of the N+ diffusion region 6 is replaced with the P+ diffusion region 14.

In the sectional structure of the channel contact region 1b shown in FIG. 17, the insulation region 13 is formed in a place where the channel region 7 in the MOSFET region 1a is supposed to be formed. This insulation region 13, as described with reference to FIG. 15 and FIG. 6, is formed in a way dividing the channel region 7 in the MOSFET region 1a of each finger in the with direction of the gate. In other words, in the channel contact region 1b, the channel region 7 in the MOSFET region 1a is replaced with the insulation region 13. On the insulation region 13, the interdigital gate electrode 19 is formed. On both sides of the interdigital gate electrode 19, which are parallel with the width direction of the gate, sidewalls 15 are formed.

In the sectional structure of the VI-VI', the N+ diffusion region 6 is located in the area on the opposite side of the P+ diffusion region 14 while the insulation region 13 lies in between the N+ diffusion region 6 and the P+ diffusion region 14. Silicide films 6a, 14a and 9a are formed on the surfaces of the N+ diffusion region 6, the P+ diffusion region 14 and the interdigital gate electrode 19, respectively. By silicidising the surfaces of the N+ diffusion region 6, the P+ diffusion region 14 and the interdigital gate electrode 19, the resistance at these portions can be decreased, and it will be possible to obtain favorable current characteristics. On the salicidised N+ diffusion region 6 and the P+ diffusion region 14, contacts 10 are formed, respectively, for electrically connecting the N+ diffusion region 6 and the P+ diffusion region 14 with a metal layer (not shown).

(Structure of VII-VII' Section)

Figure 18:
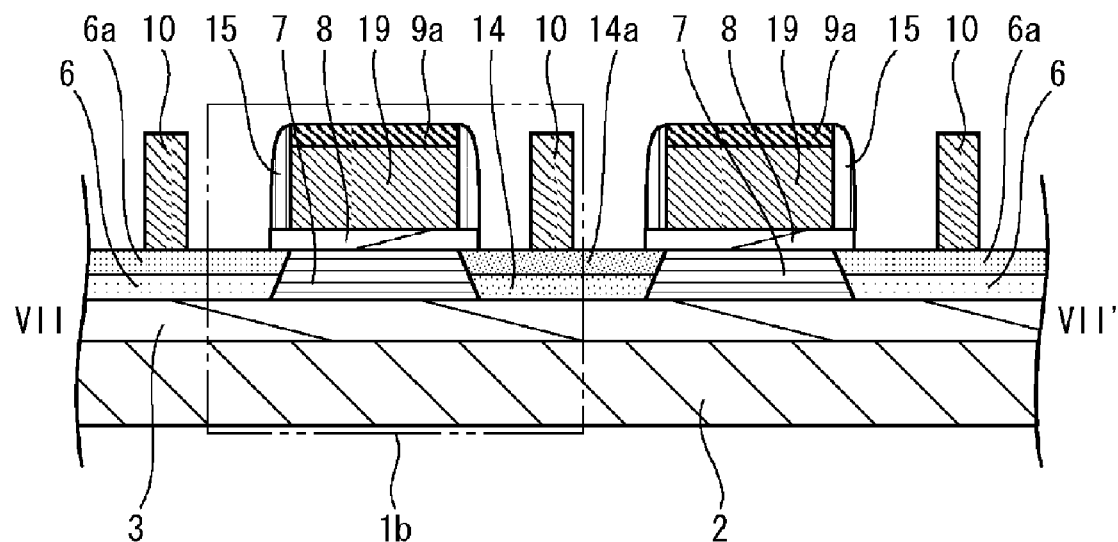
FIG. 18 is a sectional view showing a section VII-VII' of the interdigital SOI-MOSFET device according to the second embodiment of the present invention.

Next, the structure of the VII-VII' section indicated in FIG. 15 will be described with reference to FIG. 18. As shown in FIG. 18, the structure of the VII-VII' section, i.e. the sectional structure of the channel contact region 1b in the vicinity of the MOSFET region 1a, is the same as the structure of the III-III' section shown in FIG. 4 of the first embodiment. However, between the channel contact regions 1b adjoining in the length direction of the gate, the P+ diffusion region 14 is formed continuingly in a way intervening between the channel contact regions 1b. Specifically, in the structure of the VII-VII' section in FIG. 15, the P+ diffusion region 14 and the insulation region 13 are formed in the active region of the SOI substrate. In addition, the structure of the VII-VII' section includes the N+ diffusion region 6 of the MOSFET region 1a, the gate oxide film 8 and the interdigital gate electrode 19. In this sectional structure of the channel contact region 1b, the channel region 7 is an extended region of the channel region 7 in the MOSFET region 1a, and the P+ diffusion region 14 is a continuing region of the P+ diffusion region 14 shown in FIG. 17. On the channel region 7, the gate oxide film 8 is formed. On both sides of the interdigital gate electrode 19, which are parallel with the width direction of the gate, sidewalls 15 are formed.

As shown in FIG. 18, in the sectional structure of the VII-VII', the N+ diffusion region 6 is located in the area on the opposite side of the P+ diffusion region 14 while the channel region 7 lies in between the N+ diffusion region 6 and the P+ diffusion region 14. The silicide films 6a, 14a and 9a are formed on the surfaces of the N+ diffusion region 6, the P+ diffusion region 14 and the interdigital gate electrode 19, respectively. By silicidising the surfaces of the N+ diffusion region 6, the P+ diffusion region 14 and the interdigital gate electrode 19, the resistance at these portions can be decreased, and it will be possible to obtain favorable current characteristics. On the salicidised N+ diffusion region 6 and the P+ diffusion region 14, contacts 10 are formed, respectively, for electrically connecting the N+ diffusion region 6 and the P+ diffusion region 14 with the metal layer (not shown).

(Structure of VIII-VIII' Section)

Figure 19:
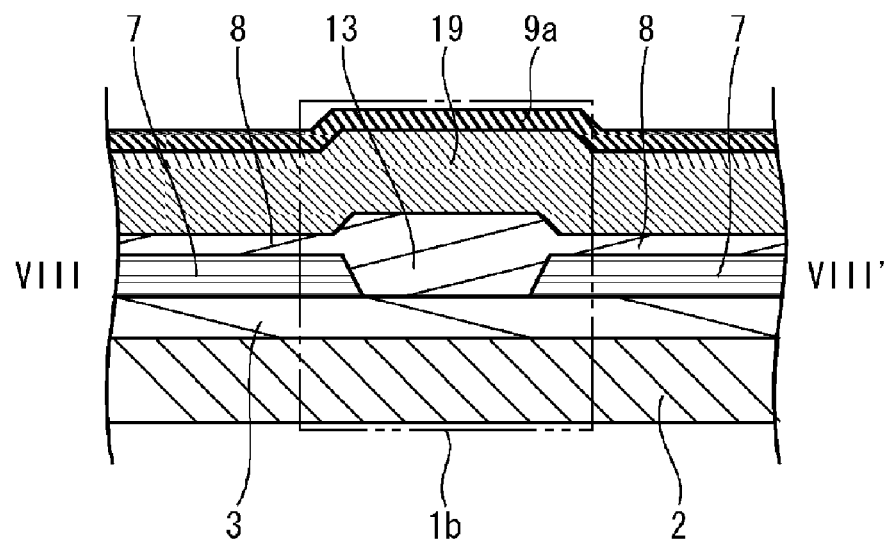
FIG. 19 is a sectional view showing a section VIII-VIII' of the interdigital SOI-MOSFET device according to the second embodiment of the present invention.

Next, the structure of the VIII-VIII' section indicated in FIG. 15 will be described with reference to FIG. 19. As shown in FIG. 19, the structure of the VIII-VIII' section, i.e. the sectional structure of the channel contact region 1b in the surface which is vertical with the longitudinal direction of the channel, is the same as the structure of the IV-IV' section shown in FIG. 5 of the first embodiment. Specifically, in the structure of the VIII-VIII' section in FIG. 15, the P+ diffusion region 14 and the insulation region 13 are formed in the active region of the SOI substrate. In addition, the structure of the VIII-VIII' section includes the channel region 7 of the MOSFET region 1a and the interdigital gate electrode 19. In this sectional structure of the channel contact region 1b, the channel region 7 is an extended region of the channel region 7 in the MOSFET region 1a. The insulation region 13, as described above with reference to FIG. 15 and FIG. 6, is formed in a way dividing the channel region 7 formed along the finger of the interdigital gate electrode 19 in the width direction of the gate. On the insulation region 13, the interdigital gate electrode 19 continuing from the MOSFET region 1a is formed. On the interdigital gate electrode 19, as described with reference to FIG. 17 or FIG. 18, the salicide film 9a is formed and it contributes to decreasing the resistance at this portion.

As described above, in the interdigital SOI-MOSFET device 1A according to the second embodiment of the present invention, the P+ diffusion region 14 is formed adjacent to one of the two portions of the N+ diffusion region 6 in the MOSFET region 1a in the width direction of the gate, and it is formed such that at least a portion of it is in contact with (or superimposed on) the channel region 7. On this P+ diffusion region 14 contacts 10 are formed. By these arrangements, as with the case of the second embodiment, the channel region 7 and the contacts 10 are electrically connected, and it is made possible to draw out the electric charge (i.e. electron holes) that has accumulated in the channel region 7 from the contacts 10 via the P+ diffusion region 14. As a result, it is possible to minimize the Kink effect, and obtain preferable characteristics.

Furthermore, in the interdigital SOI-MOSFET device 1A according to this embodiment of the present invention, the P+ diffusion region 14, which functions as the wiring for drawing out electric charge from the channel region 7, is formed adjacent to the N+ diffusion region 6 in the width direction of the gate. In other words, in this embodiment, the region which has conventionally been used as the N+ diffusion region is used as the P+ diffusion region 14. By this arrangement, the layout in the region which should be used as the N+ diffusion region 6 as usual does not have to be changed. In addition, in this embodiment, the contacts which have conventionally been used as the contacts on the N⁺ diffusion region can be used as the contacts (10) on the P⁺ diffusion region 14. Therefore, the layout of the contacts (10) formed on the N⁺ diffusion region 6 and the P⁺ diffusion region 14 does not have to be changed. In other words, in this embodiment of the present invention, the layout and masks as used conventionally can be used almost without modifications, and therefore, it is possible to keep necessary design changes to a minimum. As a result, it is possible to keep the design cost to a minimum as well. Moreover, since there is no need for reducing the number of contacts, it is possible to prevent possible influence which such reduction in the number of contacts can give to the current characteristics.

Furthermore, in this embodiment of the present invention, by using the interdigital gate electrode 19, the N⁺ diffusion region 6 can be shared between any two MOSFETs, which are adjacent in the longitudinal direction of the channel, among the MOSFETs formed in each line in the interdigital gate electrode 19. Therefore, the element mounting area can be minimized.

Moreover, as with the case of the first embodiment of the present invention, by adding in the width direction of the gate with respect to each disposition, a channel region 7 and a corresponding N⁺ diffusion region 6 having the same width as that in which the insulation region 13 in the channel contact region 1b is formed, it is possible to easily realize a MOSFET which has characteristics and functions equal to a conventional MOSFET.

Manufacturing Method

A method of manufacturing the interdigital SOI-MOSFET device 1A according to this embodiment of the present invention is the same as the method shown in FIG. 9A to FIG. 13C of the first embodiment of the present invention, and therefore redundant explanations will be omitted. In addition, in FIGS. 9A to 10C, the gate electrode 9 is replaced with the interdigital gate electrode 19.

Although the above description mainly referred to a case where the N-MOSFET is formed on the SOI substrate, the present invention is not limited to this case. For instance, the N-MOSFET can be replaced with a P-MOSFET. In this case, the P⁺ diffusion region 14 is replaced with a N⁺ diffusion region having a conductivity type opposite to that of the P⁺ diffusion region 14. Furthermore, specific materials and film thicknesses etc. are mentioned in the above description, such terms and figures are provided for illustrative purpose only. Accordingly, it is to be understood that the present invention is not limited to such specific terms and figures, and changes and variations can be made.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2004-348198. The entire disclosures of Japanese Patent Application No. 2004-348198 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. An SOI semiconductor device comprising:
   a substrate;
   an insulation film on the substrate;
   a silicon film on the insulation film;
   a gate insulation film on the silicon film;
   a gate electrode on the gate insulation film;
   a channel region under the gate electrode;
   a pair of first diffusion regions in the silicon film that are in direct electrical contact with and sandwich a first section of the channel region therebetween; and
   a second diffusion region in direct contact with a second section of the channel region and disposed laterally next to the second section of the channel region in a gate length direction, and adjoining one of the first diffusion regions in a gate width direction, the second diffusion region having a same conductivity type as the channel region.

2. The SOI semiconductor device according to claim 1, wherein the second diffusion region has a conductivity type opposite to that of the first diffusion regions.

3. An SOI semiconductor device comprising:
   a substrate;
   an insulation film on the substrate;
   a silicon film on the insulation film;
   a gate insulation film on the silicon film;
   a gate electrode on the gate insulation film;
   a channel region under the gate electrode;
   a pair of first diffusion regions in the silicon film that are in direct electrical contact with and sandwich a first section of the channel region therebetween;
   a second diffusion region in direct contact with a second section of the channel region and disposed laterally next to the second section of the channel region in a gate length direction, and adjoining one of the first diffusion regions in a gate width direction, the second diffusion region having a same conductivity type as the channel region; and
   an insulation region in the channel region, the insulation region divides the channel region along the gate width direction of the gate electrode.

4. The SOI semiconductor device according to claim 3, wherein the insulation region adjoins the second diffusion region.

5. The SOI semiconductor device according to claim 3, further comprising:
a third diffusion region in the silicon film, the third diffusion region having a same conductivity type as the first diffusion regions, the third diffusion region and the second diffusion region sandwich the insulation region therebetween.

6. The SOI semiconductor device according to claim 1, wherein the second diffusion region has a same conductivity type as the channel region, and an impurity concentration of the second diffusion region is higher than that of the channel region.

7. The SOI semiconductor device according to claim 3, wherein the insulation region is a silicon oxide film.

8. The SOI semiconductor device according to claim 1, further comprising:
salicide films on the first and second diffusion regions.

9. The SOI semiconductor device according to claim 1, further comprising a plurality of the second diffusion regions, respective ones of the second diffusion regions are disposed every predetermined distance along the gate width direction of the gate electrode.

10. The SOI semiconductor device according to claim 3, further comprising a plurality of the second diffusion regions and a plurality of the insulation regions, respective pairs including one of the second diffusion regions and one of the insulation regions are disposed every predetermined distance along the gate width direction of the gate electrode.

11. The SOI semiconductor device according to claim 1, wherein the gate electrode has an interdigital shape having fingers.

12. The SOI semiconductor device according to claim 11, further comprising:
element structures along each finger, the element structures including a pair of the first diffusion regions,
wherein the element structures which adjoin each other in the gate length direction of the gate electrode share at least one of the first diffusion regions located between two of the fingers, and
wherein the second diffusion region is in contact with the first regions of two of the element structures adjoining in the gate length direction of the gate electrode while adjoining at least one of the first diffusion regions, and is shared by the two of the element structures adjoining in the gate length direction of the gate electrode.

13. An SOI semiconductor device comprising:
a substrate;
an insulation film on the substrate;
a silicon film on the insulation film;
a gate insulation film on the silicon film;
a gate electrode on the gate insulation film;
a channel region under the gate electrode;
a pair of first diffusion regions in the silicon film that are in direct electrical contact with and sandwich a first section of the channel region therebetween;
an insulation region in a second section of the channel region, the insulation region isolating the channel region along a gate width direction; and
a second diffusion region in direct contact with the insulation region, a third section of the channel region and one of the first diffusion regions, the second diffusion region disposed laterally next to the channel region in a gate length direction and having a same conductivity type as the channel region.

14. The SOI semiconductor device according to claim 13, wherein the second diffusion region has a conductivity type opposite to that of the first diffusion regions.

15. The SOI semiconductor device according to claim 13, wherein the second diffusion region has a same conductivity type as the channel region, and an impurity concentration of the second diffusion region is higher than that of the channel region.

16. The SOI semiconductor device according to claim 13, wherein the insulation region is a silicon oxide film.

17. The SOI semiconductor device according to claim 13, further comprising salicide films formed on the first and second diffusion regions.

18. The SOI semiconductor device according to claim 13, further comprising a plurality of the second diffusion regions, respective ones of the second diffusion regions are disposed every predetermined distance along the gate width direction of the gate electrode.

19. The SOI semiconductor device according to claim 13, further comprising a plurality of the second diffusion regions and a plurality of the insulation regions, respective pairs including one of the second diffusion regions and one of the insulation regions are disposed every predetermined distance along the gate width direction of the gate electrode.

* * * * *